Figure 1:
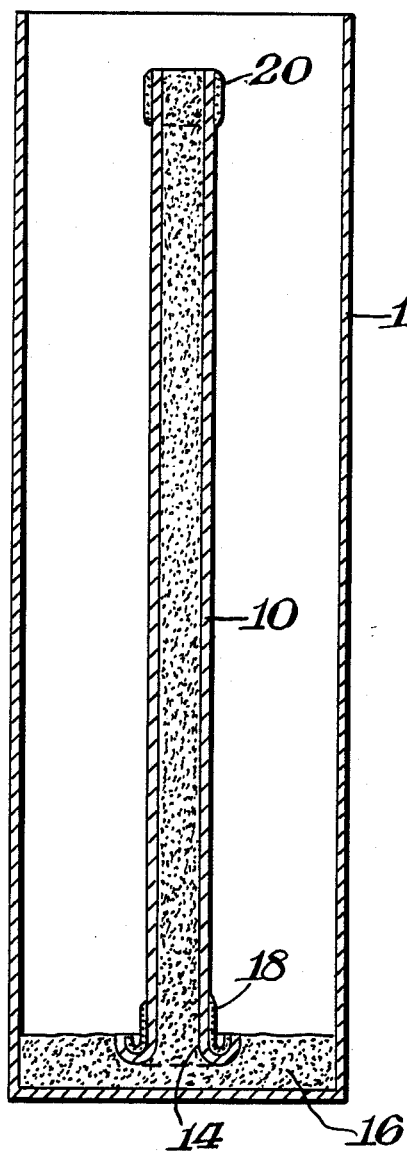

United States Patent [19]

Baldi

[11] Patent Number: 4,820,362
[45] Date of Patent: Apr. 11, 1989

[54] METAL DIFFUSION AND COMPOSITION
[75] Inventor: Alfonso L. Baldi, Wynnewood, Pa.
[73] Assignee: Alloy Surfaces Company, Inc., Wilmington, Del.
[21] Appl. No.: 685,910
[22] Filed: Dec. 27, 1984

Related U.S. Application Data

[63] Continuation-in-part of Ser. No. 479,211, Mar. 23, 1983, Pat. No. 4,476,744, and a continuation-in-part of Ser. No. 571,510, Jun. 17, 1984, Pat. No. 4,537,927, and a continuation-in-part of Ser. No. 310,085, Oct. 9, 1981, Pat. No. 4,617,202, and a continuation-in-part of Ser. No. 416,353, Jun. 2, 1982, abandoned, and a continuation-in-part of Ser. No. 359,212, Mar. 18, 1982, Pat. No. 4,443,557, and a continuation-in-part of Ser. No. 584,538, Feb. 28, 1984, and a continuation-in-part of Ser. No. 281,405, Jul. 8, 1981, Pat. No. 4,708,913, and a continuation-in-part of Ser. No. 507,174, Jun. 23, 1983, Pat. No. 4,694,036, and a continuation-in-part of Ser. No. 538,541, Oct. 3, 1983, and a continuation-in-part of Ser. No. 559,334, Dec. 8, 1983, abandoned, and a continuation-in-part of Ser. No. 643,782, Jul. 17, 1984, and a continuation-in-part of Ser. No. 000,220, Feb. 23, 1982, and a continuation-in-part of Ser. No. 488,103, Apr. 25, 1983, which is a continuation-in-part of Ser. No. 172,671, Jul. 28, 1980, Pat. No. 4,435,481, which is a continuation-in-part of Ser. No. 238,500, Feb. 26, 1981, Pat. No. 4,350,719, which is a continuation-in-part of Ser. No. 851,504, Nov. 14, 1977, abandoned, which is a continuation-in-part of Ser. No. 242,350, Mar. 10, 1981, Pat. No. 4,464,430, which is a continuation-in-part of Ser. No. 071,741, Aug. 30, 1979, abandoned, which is a continuation-in-part of Ser. No. 230,333, Feb. 2, 1981, Pat. No. 4,347,267, which is a continuation-in-part of Ser. No. 302,979, Sep. 17, 1981, abandoned.

[51] Int. Cl.[4] ............................................. C06G 45/00
[52] U.S. Cl. ................................................ 149/2; 149/22; 149/37; 149/42; 149/109.6; 149/114; 149/43
[58] Field of Search .................. 149/2, 22, 37, 42, 43, 149/109.6, 114

[56] References Cited

U.S. PATENT DOCUMENTS

| 2,062,011 | 11/1936 | Norman et al. | 149/3 |
| 3,720,552 | 3/1973 | Lustigue | 149/3 |
| 4,292,208 | 9/1987 | Baldi et al. | 428/682 |
| 4,349,612 | 9/1982 | Baldi | 149/15 |
| 4,435,481 | 3/1984 | Baldi | 149/15 |

Primary Examiner—Stephen J. Lechert, Jr.
Attorney, Agent, or Firm—Connolly and Hutz

[57] ABSTRACT

Low alloy steel tubes are decarburized, heavily diffusion chromized and heavily diffusion aluminized to protect them against sulfidation. For the diffusion they can be supported upright with one end on layer of diffusion-coating pack on floor of a retort. Surface portions that are to be welded are covered with masking layer that prevents diffusion coating, or with inert layer that reduces the amount of coating. Diffusion aluminizing can also be applied to foils and powder to make pyrophoric product after leaching out much of the introduced aluminum. Powder can also be diffusion boronized. Pyrophoric boron-containing iron or nickel powder mixed with $Ba(NO_3)_2$ will ignite to cause generation of large quantity of $NO_2$ gas, and generation is improved when powdered boron and/or oxidizer like $NaClO_3$ is added. Pyrophoric articles containing substantial alloyed boron can be placed in good thermal contact with cool heat sink and exposed to air to stabilize them so that they do not begin to pyrophorically react unless heated to over 70° C. Magnesium powder mixed with powdered boron and $Ba(NO_3)_2$ makes explosive composition.

9 Claims, 4 Drawing Sheets

U.S. Patent  Apr. 11, 1989  Sheet 1 of 3  4,820,362

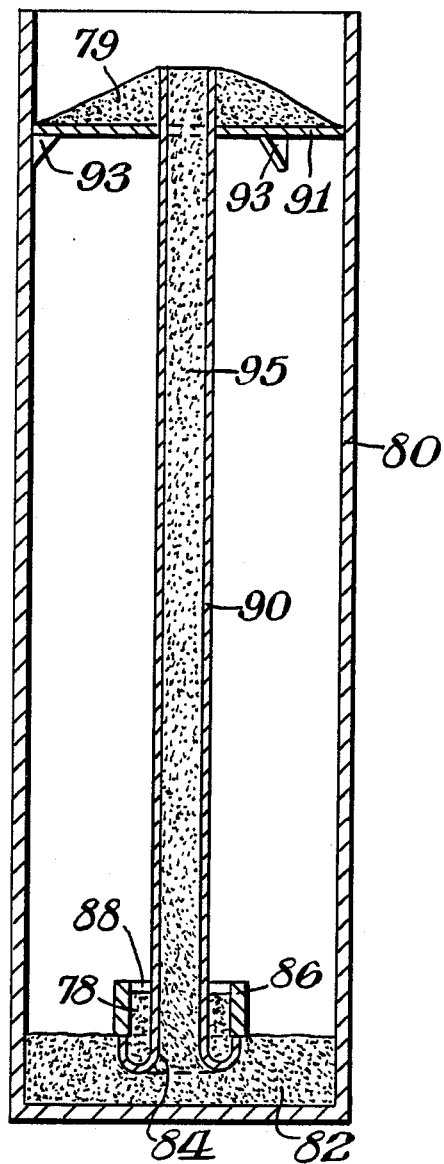
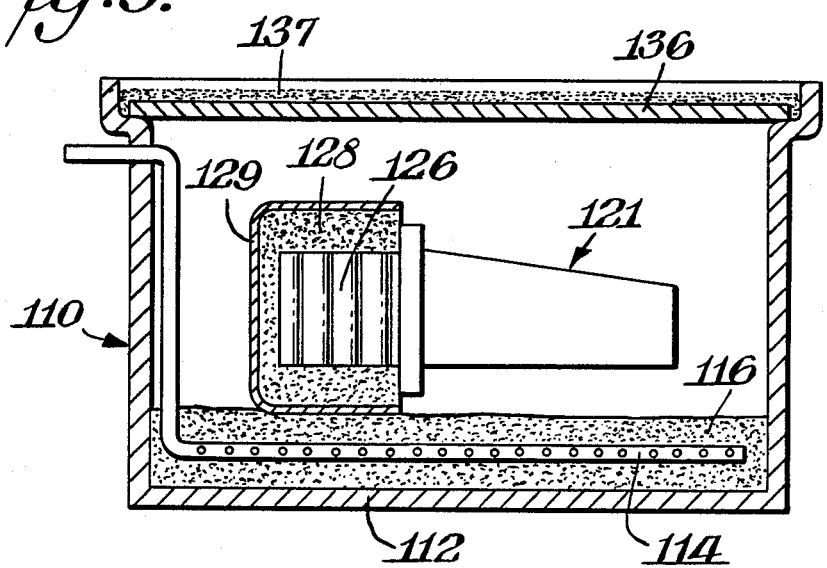

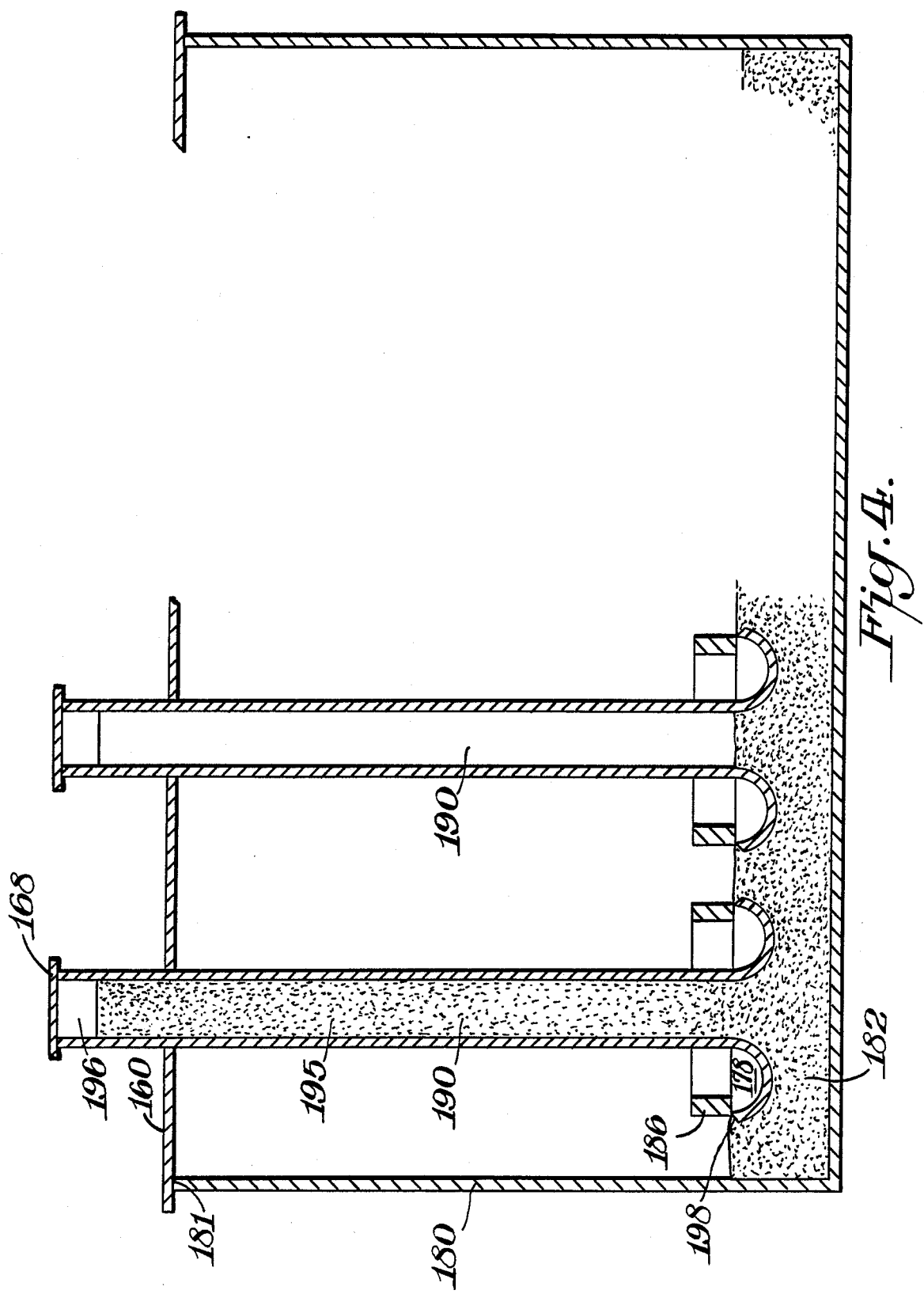

METAL DIFFUSION AND COMPOSITION

This application is a continuation-in-part of the following prior applications:

| U.S. SER. NO. | FILING DATE |
| --- | --- |
| 479,211 | March 23, 1983, U.S. Pat. No. 4476244 |
| 571,510 | January 17, 1984 |
| 310,085 | October 9, 1981 |
| 416,353 | June 2, 1982 (subsequently abandoned) |
| 359,212 | March 18, 1982 |
| 584,538 | February 28, 1984 |
| 281,405 | July 8, 1981, U.S. Pat. No. 4708913 |
| 507,174 | June 23, 1983 |
| 538,541 | October 3, 1983 |
| 559,334 | December 8, 1983 (subsequently abandoned) |
| 643,782 | July 17, 1984 |
| PCT No. US82/00220 | February 23, 1982 |
| 488103 | April 25, 1983 |

All of which in turn are continuations-in-part of one or more of the following still earlier patent applications:

| U.S. SER. NO. | FILING DATE | STATUS |
| --- | --- | --- |
| 172,671 | July 28, 1980 | U.S. Pat. No. 4,435,481 granted March 6, 1984 |
| 238,500 | Feb. 26, 1981 | U.S. Pat. No. 4,350,719 granted Sept. 21, 1982 |
| 851,504 | Nov. 14, 1977 | Subsequently Abandoned |
| 242,350 | March 10, 1981 | U.S. Pat. No. 4,464,430 granted Aug. 7, 1984 |
| 71,741 | Aug. 30, 1979 | Subsequently Abandoned |
| 230,333 | Feb. 2, 1981 | U.S. Pat. No. 4,347,267 granted Aug. 31, 1982 |
| 302,979 | Sept. 4, 1981 | Subsequently Abandoned |

The present invention relates to diffusion coating and to compositions used in or made with the help of diffusion coating.

Among the objects of the present invention is the provision of novel coating techniques and compositions for use therewith, as well as products and compositions made with or without the help of diffusion coating.

The foregoing, as well as further objects of the present invention will be more fully understood from the following description of several of its exemplifications, reference being made to the accompanying drawings in which FIGS. 1, 2, 3, 4 and 5 are vertical sectional views illustrating diffusion coating techniques typifying the present invention.

One aspect of the present invention concerns the protection of metals against attack by chemicals, particularly at elevated temperatures.

For increasing the resistance of steels, even low alloy steels, to attack by hot sulfur-containing materials, chromizing is very effective when it penetrates more than about 3 mils and is followed by an even deeper aluminizing. Less penetrating treatment of low alloy steel is suggested in U.S. Pat. No. 3,785,854, and is disclosed for superalloys in U.S. Pat. Nos. 3,764,371, 3,694,255 and 4,041,196. A similar treatment is disclosed in U.S. Pat. No. 3,656,919, but the present invention applies a very penetrating sequence to low alloy steels such as those called chromium steels. These chromium steels of the present invention contain from about 0.6% to about 1.5% chromium, and their carbon contents can range from about 0.15% to about 1.10%. This carbon content is not in stabilized form and is accordingly sufficient to seriously limit the case depth obtained by chromizing, as well as correspondingly limit the maximum resistance obtainable against hot sulfidation. Unprotected low alloy steels used in petroleum refinery operations for example, are generally very susceptible to hot sulfidation, so that a high degree of protection is called for.

According to the present invention low alloy steels such as the above-noted chromium steels have their surfaces first decarburized to a depth of at least about 3 mils, then chromized to provide a case at least about 2 mils thick, and then aluminized to a depth of at least about 6 mils. One preferred decarburizing is to a depth of 4 to 6 mils, along with chromizing to provide a case thickness of about 3 to 4 mils, and aluminizing to a final diffusion case of about 10 to about 14 mils. Another preferred decarburizing is to a depth of 8 to 10 mils, followed by chromizing to a case depth of 11 to 12 mils, and aluminizing to a depth of about 20 mils.

The respective treatments can be applied individually in spaced operations, or they can be combined as successive stages of a single heat sequence. Each stage can be a conventional one such as:

EXAMPLE I

1. A number of chromium steel tubes used for a heat exchanger in the oxidative cracking of sulfur-containing petroleum residues were cleaned, and then placed in a retort through which hydrogen having a dew point of 40 to 60° F. is passed, while the retort is heated to 1800 to 1850° F. for three hours. Before the treatment, the tubes had 0.7 to 0.8% chromium and 0.18% carbon, their side walls were about ¼-inch thick, their internal diameter about two inches, and one end of each tube was flared out and mushroomed back. After the three-hour treatment, heating was discontinued and the tubes permitted to cool to room temperature. They showed a surface decarburization about 6 mils deep.

2. The decarburized tubes were then loaded in a vertical retort, the floor of which had a four-inch thick layer of powdered chromizing pack into which the flared ends were embedded. The interior of the tubes were filled with the same chromizing pack, which was a pre-fired 1:4 by weight mixture of chromium powder and the fluent tabular $Al_2O_3$ described in U.S. Pat. No. 4,208,453, with ½% $NH_4Cl$ based on the weight of the 1:4 mixture. The retort was then covered and fired as in U.S. Pat. No. 3,801,357 to bring its contents to 1950° F. to 1975° F. for ten hours. Upon subsequent cool-down the tubes showed a chromized case 3 to 4 mils thick, the outer quarter having a chromium-carbide-rich phase with the remainder having a columnar ferrite structure.

3. The chromized tubes were returned to the vertical retort, which this time contained a layer of aluminizing powder pack, and the tube interiors were filled with the same aluminizing pack—a pre-fired mixture of 45 weight % chromium powder, 10 weight % aluminum powder and 45 weight % powdered alumina, activated with ½% $NH_4Cl$. The aluminizing heat was at 1950° F. to 1975° F. for ten hours and left a consolidated diffusion case 12 to 14 mils thick. The outer surface of this case contained about 21% aluminum and about 21% chromium, whereas the middle of the case contained about 12.5% aluminum and about 13.7% chromium. These tubes showed a very high resistance against hot sulfidation, and in one instance a tube was attacked so severely that the steel base was completely eaten through leaving an almost unscathed diffusion case as a shell. That tube apparently had had its coating damaged in handling, exposing a little of the tube core to attack.

A typical tube of the foregoing type is illustrated at 10 in FIG. 1, where it is shown held in a retort 12 with its reversely flared end 14 imbedded in one of the diffusion coating packs. Where the tube has an external surface portion that is not to receive a diffusion coating, as for instance, because that portion is closely fitted or welded into a mounting sheet or the like, that surface portion can be masked. Thus, a slurry type powdered alumina masking coating can be applied as illustrated at 18 and 20. Alternatively, a powder type masking mixture can be poured into the cup-shaped portion of flare 14, and if desired, such powder can be held in place with the help of a steel ring fitted around the powder and resting on the upturned lip of the flare.

The decarburizing can be conducted in any convenient way, although it is preferred to use hydrogen having a dew point at least as high as 0° F. The decarburizing temperature can vary in the manner shown in the prior art, and effective decarburizing produces a weight loss of from about 0.3 to about 0.6 milligrams per square centimeter of treated surface. This can be checked by including in the retort a spare coupon of the metal being treated and withdrawing the coupon to check its weight. If desired, the decarburizing can be more vigorous and produce a weight loss of as much as 1 milligram per square centimeter of treated surface.

The diffusion chromizing and aluminizing can also be varied as disclosed in the prior art. A good chromium pick-up is at least 15 and better still over 25 milligrams per square centimeter of surface, and a good aluminum pick-up is at least 25 and preferably over 40 milligrams per square centimeter. Another good combination has a pick-up of over 30 milligrams of chromium per square centimeter and a pick-up of about 20 to about 40 milligrams aluminum per square centimeter.

Although the aluminum pick-up appears large when measured in milligrams per square centimeter, the aluminum penetration is so deep and aggressive that the aluminum concentration at the surface can be as little as about 5% by weight. The aluminizing also causes the chromium diffusion to deepen, but the final concentration of chromium at the surface is generally at least about 15%.

The separate treatments can be partially or completely run together in a single retort without removing the tubes from the retort between treatment steps. Some combinations of decarburizing with chromizing are mentioned in U.S. Pat. No. 3,449,159, but the decarburizing of the present invention is a very substantial one in which the decarburized zone is not only deep but shows a carbon content well below 0.05%.

Gas chromizing as in U.S. Pat. No. 3,449,159 and 3,222,122 is particularly desirable when consolidating the chromizing with both the decarburizing and the aluminizing. The only pack in contact with the tubes in such a consolidation is the aluminizing pack.

Figure 2:
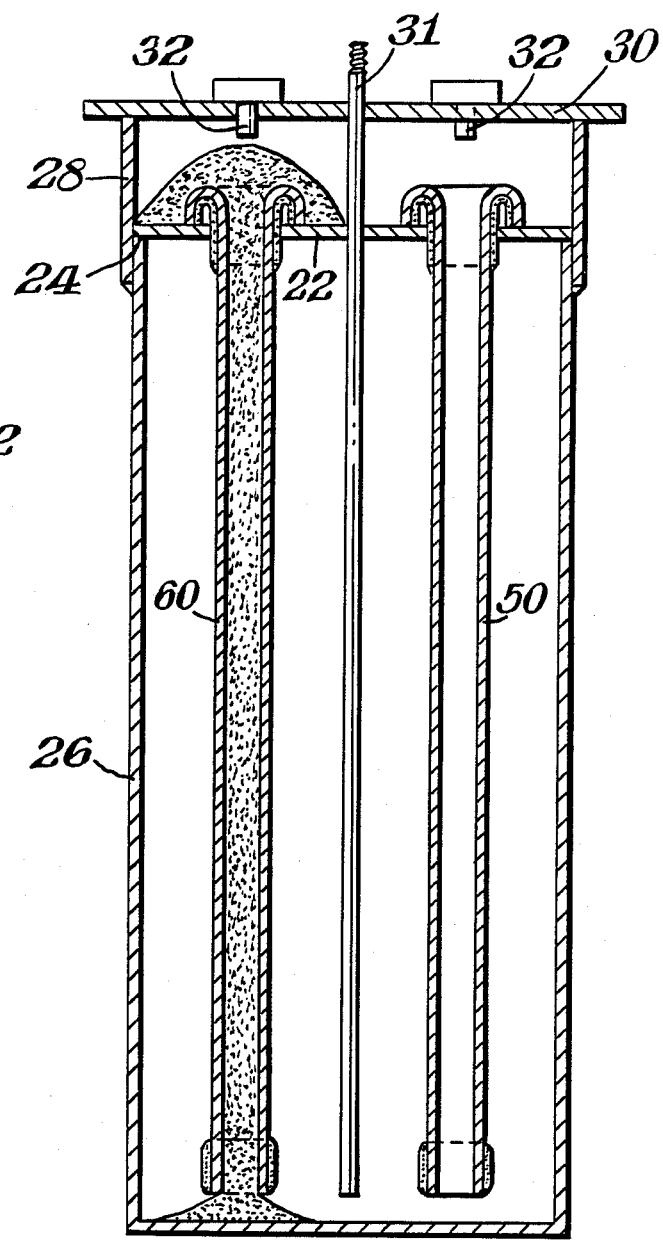

FIG. 2 illustrates a retorting arrangement for consolidated treatments. Two tubes 50 and 60 are here shown lowered through a perforated removable shelf 22 resting on the upper edge of a cylindrical retort shell which has welded around its upper margin a relatively short retort extension 28. The top of the retort is loosely covered with a plate 30 fitted with a vent pipe 31 and a set of nozzles 32 downwardly directed over each tube-receiving perforation in shelf 22. For decarburizing, the tubes are mounted as at 50 and wet hydrogen introduced through nozzles 32 so as to pass downwardly through and decarburize the interiors of the tubes. Some of the introduced hydrogen also spills over the flared tube ends and decarburizes them as well.

When the decarburizing is completed the flow of wet hydrogen is stopped, and gas chromizing streams are introduced through nozzles 32. No other change except for a shift to the chromizing temperature is needed, so that the retort can be kept at operating temperatures throughout.

The next shift is to aluminizing and for this the cover 30 or the nozzles 32 are removed so that a powder aluminizing pack can be poured into the tubes. By keeping the lower ends of the tubes within an inch or so of the retort floor a low fluency pack can be poured in place without building up very much on that floor. On the other hand a more fluent pack can be used with more of the pack spreading out on the floor as well as over the flared tube ends.

It will generally be desirable to cool the retort and its contents somewhat before introducing the aluminizing pack. To this end the burners around the retort can be shut down and a rapid flow of argon introduced through vent 31. Because no thermal insulation is present in the retort, aside from the masking layers, the tubes are fairly rapidly cooled in this way. After sufficient argon flow to flush and fill the retort with that gas, the retort cover or nozzles 32 can generally be removed even though the contents are still at about 900° F., especially if the rapid argon flow is maintained as a protective shield around the tubes and the openings at the retort top kept very small. The aluminizing pack can then be promptly poured through such openings into the tubes to further cool them both by contact as well as by volatilization of the activator contained in the pack. To avoid premature depletion of the activator when so added, the activator content of the pack can be somewhat elevated, such as 1½% by weight, instead of the usual ¼ to ½% by weight.

As soon as the pack addition is completed the retort-heating burners can be re-started to carry the retort contents to the desired aluminizing temperature. Where the aluminizing pack is a chromium-free pack, the aluminizing can be very effectively conducted at termperatures as low as 1400° F. or even lower, without much reduction in coating rate. Aluminizing at temperatures below about 1200° F. is best effected with an aluminum halide activator such as $AlCl_3$ or with anhydrous water-insoluble $CrCl_3$ or basic chromium halides as described infra.

The cooling applied before the aluminizing can be to very low temperatures if desired. Thus cooling to about 630° F. will enable the introduction of an $NH_4Cl$-activated pack without significant loss of $NH_4Cl$ by volatilization, and cooling to about 350° F. will similarly minimize loss of $AlCl_3$ from an $AlCl_3$-activated pack. Cooling to 150° F. will enable withdrawal of the chromized tubes from the retort, as for example if they are to be closely inspected to check on the chromized case or to replace or apply the masking. Cut off short pieces of tubing can be placed on shelf 22 to act as test members that can be removed when desired to check on the treatment without removing the tubes themselves.

The consolidating of the aluminizing with the previous treatments requires much more than the mere consolidation of the decarburizing with the chromizing. This simpler consolidation can also be effected with the use of a chromizing pack rather than a gas phase chromizing, so that such pack is replaced by an aluminizing pack for the aluminizing step, or additions, are made to the chromizing pack to convert it to an aluminizing pack. Thus, the chromizing pack on the floor of the retort in Example I is converted to an aluminizing pack by adding a powdered CrAl alloy having 61 parts chromium by weight to 17.8 parts of aluminum by weight. After the appropriate amount of additions, the mixture is stirred up. Alternatively, the chromizing pack on the retort floor can simply be covered with at least about two inches of aluminizing pack, preferably a pack having a little less chromium than usual.

The exteriors of the tubes subjected to the three-step treatment of decarburizing, chromizing and aluminizing, also show the effects of such treatment steps, although these effects are minimized at the masked areas. The decarburized exterior surfaces become chromized to some degree and this strengthens those surfaces.

The hydrogen used for decarburizing, and/or the gas chromizing gases, can be introduced at the bottom of the retort instead of at the top, in which cases tube 31 can be the gas inlet and one or more of the nozzles 32 can act as a vent.

Other chromium steels and other low alloy steels can be treated in place of the foregoing tubes, to give similarly protected products. Plain steels having about 0.1% or less of carbon are generally not strong enough or sufficiently resistant for use in hot environments, but they too can be similarly chromized and aluminized to yield products showing very little corrosion in hot sulfidation environments, and do not need a preliminary decarburizing. Steels that have their carbon contents stabilized as noted in U.S. Pat. No. 3,449,159, likewise need no decarburizing.

A high degree of decarburizing is desirable for unstabilized carbon contents, inasmuch as this enables very heavy diffusion chromizing. The following is an exemplification.

EXAMPLE II

The procedure for Example I is followed, with the following changes:

A. The decarburizing is conducted at 1825 to 1875° F. for six hours with wet hydrogen having a dew point at least as high as 20° F. to yield a decarburized surface 8 to 10 mils deep.

B. The chromizing is conducted with a non-prefired pack of 20% chromium and 80% non-fluent alumina, activated as in Example I. The chromizing is as 2050 to 2100° F. for 10 hours, leaving a chromized case 11 to 12 mils deep essentially all columnar ferrite and with little or no distinguishable chromium-carbide-rich phase. It is noted that the chromizing causes a little increase in the decarburizing depth, and is as deep as the resulting decarburizing. The surface chromium content is about 50 milligrams per square centimeter. The chromizing also causes significant loss of carbon from the body of the substrate.

C. The aluminizing is conducted with a prefired or non-prefired pack of, by weight:

5.4%: aluminum
46.4%: chromium
balance alumina activated as in Example I. The aluminizing temperature is 2050 to 2100° F. for 10 hours. The resulting case is about 20 mils deep and the aluminum concentration at the surface is about 12%.

Modifying Example II by reducing the aluminum content of the aluminizing pack to 2.5% and its chromium to 43.5% yields a case depth of about 18 mils and a surface aluminum content of about 6%.

The products of Example II show a somewhat better resistance than that of Example I, to oxidative and sulfide attack at 1500° F.

Without the final aluminizing the chromized tubes also show very good resistance to oxidative and sulfidative attack, and the greater the chromium in the diffusion case the higher the resistance. However even the resistance of a chromized tube having a chromized skin with 30 to 40% chromium content is improved by a subsequent aluminizing. Where expenses are to be minimized the aluminizing can be omitted for such highly chromized cases.

The masking compositions used in the foregoing examples are preferably free of metallic aluminum or metallic aluminides. Alumina alone is an effective maskant for the techniques of the examples, inasmuch as the masking is not in a location contacted by a diffusion coating pack.

On ordinary irons and steels as well as low alloy steels a localized layer of powdered iron appropriately diluted with inert diluent such as alumina with or without binder, can be applied to reduce or prevent diffusion coating under the layer. This layer can be covered by a sheath-forming layer, but such covering is not needed where the workpieces are not roughly handled during treatment.

Powdered iron containing chromium can also be used, suitably diluted, particularly to mask chromium steels against aluminizing. Nickel can also be present in such a masking powder, even though it tends to diffuse into the masked surface, because it does such a good job of tying up aluminum. It is generally more important to keep aluminum from diffusing into the surfaces to be masked, inasmuch as the aluminizing is so agressive and frequently leaves a surface difficult to weld. It takes at least about 20 weight % diluent powder of non-metallic masking ingredients to keep metallic masking compositions from sintering to the workpiece. For very high diffusion temperatures, the diluent powder is preferably at least 30 weight %.

Where the presence of a little aluminum can be tolerated, the masking compositions of U.S. Pat. No. 4,208,453 can be used.

A particularly effective masking technique is shown in the following example.

EXAMPLE III

The tubes of Example I are given the decarburizing treatment of that Example, after which they are subjected to chromizing as in Example II but with the chromizing pack containing 30% chromium by weight, and the time at chromizing temperature extended to 15 hours. The internal tube surfaces then show a chromized case about 14 mils deep with its surface having a chromium content of at least about 30%. In some instances a very thin skin, about 0.5 mil thick, of very concentrated chromium carbides such as $Cr_{23}C_6$ forms on the chromized surfaces, and such skin can have a chromium content of about 70%.

The chromized tubes are given a masked aluminizing using a powdered aluminizing pack composed of 450 pounds chromium
30 pounds aluminum 520 pounds aluminum oxide
10 pounds NH₄Cl That pack is broken in by pre-firing at 1975°–2000° F. for 12 hours, after which the pack is cooled and fresh NH₄Cl is added. Any chromium carbide skin present does not interfere with the aluminizing, and in fact such carbide is substantially completely reduced by the aluminizing.

As shown in FIG. 3, a tall retort 80 has a relatively shallow layer 82 of broken-in aluminizing pack poured over its floor. A tube 90 is then lowered into the retort with its mushroomed end 84 down. Before lowering, a ring 86 of 1010 steel is placed over the mushroomed end to form a chamber 88 that will retain powder. In this chamber is placed a broken-in powdered masking mixture 78 having the following composition 1806 grams chromium
    995 grams iron
    1204 grams nickel
    10,000 grams Al₂O₃.

The breaking in of the masking composition is effected by first adding to it 200 grams of NH₄Cl, mixing the combination well, and then firing it at 1750° F. for 10 hours. After the firing the NH₄Cl is all gone and no make-up of this ingredient is made.

The tube, carrying ring 86 and masking mixture 78, is then lowered into place, as shown in FIG. 3. A retaining plate 91 is then placed around the upper end of tube 90, so that it is held on lugs 93 welded to the interior of the retort. Additional broken-in masking mixture 79 is then poured on plate 91 so as to cover the outer face of tube 90, at its upper end. Tube 90 can now be filled with the aluminizing mixture 95, and the aluminizing started. Very effective aluminizing is accomplished by a 15-hour hold at 1850° F., and the aluminized surface of the resulting tube has an aluminum content of about 5.5%.

The masking mixture on plate 91 can be removed with a vacuum cleaner when the retort is ready to be unloaded, to minimize the dropping of some of that masking mixture onto aluminizing layer 82. It is generally a simple matter to withdraw tube 90 without spilling any of the masking mixture 78. If desired, however, either or both of these masking mixtures can be locked in place with an overlying sheath-forming layer as described in U.S. Pat. No. 4,208,453 to further assure that no masking mixture is spilled onto the aluminizing mixture during unloading.

Also masking mixture 79 can be confined between the outer surface of tube 90 and the inner surface of a surrounding metal ring such as 86.

The masking of Example III is very effective in holding to about zero the aluminum content of the masked outer surfaces of tube 90. It also does not significantly alter the composition of that outer surface, a difficulty frequently experienced with simpler masking compositions which have the effect of causing metal to diffuse out from the tube surface into the masking pack. For these results, the metal ingredients of the masking pack can vary as follows, by weight:

chromium—between about 5 and about 15%
    iron—between about 4 and about 10%
    nickel—between about 4 and about 12%.

When the aluminizing leaves the outer tube surface with less than about 10%, preferably less than about 7%, aluminum, welding of the tube into a ferrous tube sheet as by oxy-acetylene torch and standard low-nickel welding rod, is no great problem although it takes a little longer than the welding of a non-aluminized tube. However, the savings in not requiring the masking more than makes up for the extra welding time. A surface aluminum content below about 5% has even less effect on weldability, and can be provided as by using the aluminizing mixture of Example III at a temperature no higher than about 1800° F. for a time no longer than about 12 hours. Packs containing less or no chromium can also be used, but for shorter times and at still lower temperatures.

It is particularly desired to have the interior surface of the tubing with a chromium content of from about 30 to about 40%, and an aluminum content from about 4 to about 10%. These ranges provide exceptionally good resistance to oxidation and sulfidation, although chromium contents as low as 25%, and aluminum contents as high as 15% can be used.

FIG. 4 illustrates another diffusion-coating set-up. Here a large but relatively short cylindrical retort 180 having an open top 181, has a layer 182, initially about 3 inches deep, of diffusion-coating powder pack covering its floor. On this layer is placed a circularly-arranged set of substrate tubes 190 each positioned with its longitudinal axis vertical and its bore pre-filled with more of the powder coating pack 195. At the very top of each tube, about one inch depth of the coating pack is replaced by powdered alumina 196.

The powder 195 and 196 in the tube bores can be non-fluent and compacted within the tubes, before the tubes are inserted in the retort, so that there is no danger of the powder falling out the tube bottoms while they are moved into the retort. Each tube also carries a retaining ring 186 that fits over the tapered edge 198 of its mushroomed-back bottom end, and the space 178 within the ring 186, as well as within the mushroomed end is also filled with powdered alumina.

The tubes are spaced from each other to provide a gap of at least about ½ inch or about 15 millimeters between the projecting edges of the mushrooms.

The tubes are then propped against tilting as by a grid 160 of welded-together bars laid across the open retort mouth 181, and additional powder coating pack poured in to build up the height of layer 182 to abut the tips of rings 186. A metal plate 168 can then be loosely placed over each tube top, and an outer retort bell lowered over and around the entire assembly.

Before loading as in FIG. 4, the tubes can be decarburized in an arrangement such as shown at 50 in FIG. 2, or in a modification of such arrangement having hydrogen-introducing nozzles directed upwardly into the lower ends of the tubes. Thus, the tubes can have their mushroomed tops supported on a grid mounted over the top of an empty tall cylindrical retort, the grid extending beyond the cylindrical retort wall and in that extension having openings through which the tubes are lowered to position them outside the empty retort. A hydrogen manifold ring can then be positioned around the exterior of the retort floor, with hydrogen-discharging nozzles pointed up toward or into the respective tube bottoms.

The FIG. 4 set-up can then be used both for the chromizing as well as for the aluminizing, with the appropriate chromizing and aluminizing packs.

When a carbon-containing binder is used to hold a masking mixture in place, as described in U.S. Pat. No. 4,208,453, it can sometimes leave a little extra carbon on the substrate surface covered by the masking mixture. While such carbon deposition is not significant in substrates that contain a substantial carbon content, such deposition can be reduced or completely eliminated for substrates that contain only a small carbon content or none at all. Thus, nitrocellulose and bentonite are effective binders that leave behind little or no carbon. Nitrocellulose can thus be dissolved in nitrobenzene or nitromethane, and bentonite can be mixed with water, to each form binders to which the masking powders are added to make a masking slurry or mud.

The minimizing of carbon residue is particularly desirable when masking the so-called single crystal superalloy vanes and blades for the hot section of a jet engine. These single crystal products contain essentially no carbon, and are significantly weakened when they pick up a little carbon from a masking mixture applied in the course of a diffusion aluminizing, for example. The foregoing binders that do not deposit any significant carbon are accordingly particularly suited to provide slurry coatings such as shown at 20, for masking such diffusion aluminizing or masking diffusion coatings.

Where a masking mixture does not have to hold itself in place, as for example where a slurry-type masking layer is coated on a portin of a substrate that is embedded in a diffusion coating pack, the binder in such masking layer can be one like paraffin wax that is cleanly vaporized away at temperatures too low to cause carbonizing. Such low-temperature removal leaves the masking layer too friable to properly adhere to a workpiece surface without the backing of the diffusion coating pack.

The foregoing non-carbonizing binders can be used to bind depletion-reducing coatings as well as masking coatings. Suitable depletion-reducing ingredients are disclosed in U.S. Pat. No. 4,208,453.

For best results the single crystal superalloy workpieces are masked with binder-free masking mixtures, as in FIG. 3. Also for such purposes the nickel and any other metal in such masking mixtures should be free of detectable carbon. In addition the breaking in of such a masking mixture should not expose it to significant quantities of carbon. Thus the retort used for the break-in is preferably a carbon-free or low carbon content metal.

Masking mixtures that rely on powdered nickel have strong surface-depletion tendencies, and substituting powdered iron for two-thirds the powdered nickel, by weight, sharply reduces those tendencies without significantly impairing the masking function. Such substitution for at least half the nickel is desirable. Thus a suitable low-depleting sheath-forming masking mixture is:

1000 grams powdered nickel
2000 grams powdered iron
2400 grams powdered alumina slurried in a 5% solution of paraffin wax in mineral spirits.

Pre-alloying the nickel with the iron, as by pre-firing the powdered solids with ½% by weight NH$_4$Cl in a hydrogen-bathed retort at 1800° F. for eight hours, further reduces the surface-depletion tendencies.

These nickel-iron mixtures or alloys can be used as a top masking layer over an inert lower layer of alumina at least 20 mils thick, for masking a chromizing or aluminizing that is conducted at temperatures up to 2100° F. However for diffusion temperatures below about 1200° F., no lower layer is needed. Without a lower layer it is preferred that the powdered nickel-iron mixture or alloy be diluted with sufficient alumina, magnesia or other inert refractory powder to hold the nickel-iron content to between about 10 and about 50% by weight. When used with a lower layer, the nickel-iron masking layer preferably has a nickel-iron content of at least 40% by weight, and need contain no diluent.

The masking compositions can also contain some metallic chromium, up to about 20%, if desired, particularly when applied as a masking powder directly on workpieces made of stainless steel or other steels the surface of which contains a level of chromium, even as low as 0.5%, that should not be depleted. The presence of as much as 20% chromium in a chromium-nickel-iron or chromium-iron masking metal mixture will not prevent it from adequately masking against chromizing.

On such very effective mixture for masking stainless steels against chromizing is:

18% chromium
8% nickel
74% iron diluted with an equal volume of powdered Al$_2$O$_3$, pre-fired at 1900–1950° F. for twelve hours under hydrogen after adding 1% NH$_4$Cl.

Another such masking mixture very effective against aluminizing is:

12.9% chromium
8.6% nickel
7.1% iron
71.4% alumina pre-fired at 1750° F. for ten hours under hydrogen, after adding ½% NH$_4$Cl.

The foregoing two mixtures can also be used without pre-firing, and either way produce sheaths that adhere to the workpieces on which they are applied with or without essentially inert lower layers.

The nickel-iron mixtures tend to cause a little diffusion of iron and nickel into a substrate on which these mixtures are applied. This effect has no real significance where the substrate surface already contains at least about 25% iron. For substrate surfaces containing less iron it is preferred to keep the iron content of the sheath-forming masking below 20% by weight, and even down to 10% by weight for substrate surfaces containing less than 1% iron.

Where the aluminized skin of a ferrous metal pipe or other workpiece, has an aluminum content of about 60 atom percent or more, that aluminum content can be decreased by leaching the aluminized surface with hot concentrated aqueous KOH or NaOH. This leaching treatment can be similar to that described in parent application Ser. No. 302,979 and subsequently refiled as Ser. No. 479,211. Such treatment is more severe than the relatively mild leaching described in U.S. Pat. No. 3,764,371, particularly where the aluminized workpiece is a stainless steel. Type 304 stainless steel aluminized to an aluminum pick-up of 0.5 milligram per square centimeter can thus have its surface aluminum content reduced to simplify welding.

The aluminized and leached surfaces tend to be catalytic, particularly where the leaching is sufficiently vigorous to cause hydrogen generation, evidenced by bubbling, for at least about fifteen minutes. However, a catalytic stainless steel surface prepared this way will show no pyrophoric tendency.

A stainless steel workpiece can be provided with a catalytic pyrophoric surface, by first plating the stainless steel surface with nickel or iron, then aluminizing the plated surface, and finally leaching the aluminum out of the plating. Thus, a one to two mil thick acid nickel electroplate on 304 stainless steel can be aluminized at 750° to 800° F. for twelve hours, as in U.S. Pat. No. 4,154,705, to provide an aluminum pick-up of 1.9 to 2 milligrams per square centimeter, after which the aluminized surface can be leached in hot 20% aqueous NaOH to reduce the pick-up to about 1.1 milligrams per square centimeter. This leaves a stainless steel workpiece with a very active surface highly suited for a water-electrolyzing electrode, anode or cathode, with reduced over-voltage. It is also suitable for use as a fuel cell electrode, both anode and cathode. The active nickel surface becomes warm when first exposed to air, showing that it is pyrophorically reacting with the air. Its best cathodic electrolyzing effects are provided if kept from exposure to air or oxygen. These results are also obtained when the aluminizing is conducted at other temperatures and for other times and with other diffusion-coating packs. Similarly, the nickel platings can be deposited by ion bombardment, gas plating or other techniques, and the stainless steel can be of any other type. The stainless steel support need not be more than about 10 mils thick, and can be a foil or screen.

The high diffusion temperatures suggested in U.S. Pat. No. 4,116,804 are not desirable for aluminizing a stainless steel supported thin nickel or iron layer, inasmuch as high diffusion temperatures tend to cause some of the chromium from the stainless steel to diffuse into the thin nickel or iron layer and lower its activity for electrolytic use. It is accordingly desirable to keep the diffusion temperature below 1100° F. and to limit the dwell time at diffusion temperature to prevent chromium from reaching the outer surface of the nickel or iron coating.

The nickel or iron top coating can be given a top flash plating of silver or platinum about 0.05 mil to about 0.5 mil thick, before the aluminizing. Such a flash coat of nickel over an iron-plated stainless steel is also helpful.

Similar flash coatings can be applied over the activated nickel or iron plated stainless steels after the activation is completed by aluminizing and leaching.

Even without the stainless steel backings, a self-supporting iron or nickel screen or foil having its surfaces activated as noted, with or without the flash top coatings, make very good fuel cell electrodes, much like the similar activated metals of British Specification No. 1,289,751.

A stainless steel backed activated nickel or iron plating also makes a good catalyst for NOX reduction as described in the above-noted Patent Application Ser. No. 302,979, particularly if the diffusion step has caused some of the chromium from the stainless steel to reach the surface of the plating.

As disclosed in the parent applications, a particularly desirable masking technique involves the coating of the portions to be masked with at least one layer of a dispersion of finely divided depletion-reducing masking solid and resin in a volatile solvent, evaporating off sufficient solvent to set the coating, applying over the set coating at least one stratum of finely divided non-coherently held together to form a secure masking sheath.

The sheath-forming layer or one or more of the strata which constitute this layer, preferably have $Cr_2O_3$, nickel or mixtures of these two, as the particles that become coherently united by the aluminizing. Neither of these materials contaminate superalloy or stainless steel workpieces inasmuch as only chromium or nickel can be introduced into the workpieces from these sources, and these two metals are already present in the workpieces. Chromium and nickel are also not considered contaminants for low alloy steels, particularly those ferrous alloys containing at least 1% chromium.

The $Cr_2O_3$ and nickel particles are so actively effective that they can be diluted with as much as twice their weight of alumina or other inert filler, without losing their sheathforming ability. While they can be used in undiluted form, it is preferred to dilute these aluminizable ingredients with some filler, at least about half as much filler as active material, by weight. Such dilution diminishes the amount of material that can consume the aluminizing aluminum, and also reduces the masking cost. Moreover undiluted coatings of $Cr_2O_3$ and resin tend to crack on drying.

For best masking of those aluminizing diffusions that are conducted at extremely high temperatures, e.g., 1900° F. or higher, it is helpful to have a three-layer masking combination in which the workpiece-contacting layer is of the depletion-reducing type, the next layer of the $Cr_2O_3$ type, and the outermost layer of the nickel type.

EXAMPLE IV

A number of hot section first stage jet engine blades made of B-1900 nickel-base superalloy had their roots dipped in the following mixture:

Powdered $Ni_3Al$ having 20 to 100 micron particle size: 111 g.
Powdered chromium having 20 to 100 micron particle size: 3.4 g.
Powdered alumina having 20 to 100 micron particle size: 111 g.
Poly(ethylmethacrylate): 9 g.
Methyl chloroform: 123 g.

The resin is first dissolved in the methyl chloroform, and the remaining ingredients then added with stirring to form a uniform suspension that does not settle very rapidly.

A single dip coating treatment with the suspension at room temperature, about 60 to about 80° F., deposits a layer weighing about 130 milligrams per square centimeter after the methyl chloroform solvent is permitted to evaporate. Only a fraction of a minute is needed to complete such a coating, and it is helpful to repeat the dip several times until the combined coatings weigh about 500 milligrams per square centimeter. Dipping a previously dipped coating in the dispersion does not remove any significant portion of the previous coating, particularly if the previous coating had been permitted to dry at room temperature for at least about ½ minute.

After three or more dips as above, the thus-coated blades are dipped in the following coating mixture:

Powdered nickel, 20 to 100 micron particle size: 175 g.
Powdered alumina, 20 to 100 micron particle size: 175 g.
Poly(ethylmethacrylate): 4.7 g.

Methyl chloroform: 62.1 g.

This dipping is repeated two more times, with intervening dryings at least about ½ minute long each, to build up the latter coating to about 500 milligrams per square centimeter. The blades were then promptly inserted in a pre-fired diffusion aluminizing pack having the following composition in parts by weight Powdered aluminum, 20 to 60 micron particle size: 10
Powdered chromium, about 10 micron particle size: 40
Powdered alumina, 20 to 60 micron particle size: 50
Powdered $NH_4Cl$: 0.3 into which additional $NH_4Cl$ was blended to bring its concentration to the 0.3% value and make up for pre-firing volatilization. All of the blades were completely covered by the pack, and the mass was held in a diffusion coating retort. Diffusion coating was then carried out with a 6 hour hold at 1875° F. in the manner described in U.S. Pat. No. 3,785,854. The blades are then removed from the cooled retort and carry a hard shell-like sheath or crust where the roots had been covered with the masking dips. These crusts are quite adherent and coherent, so that the aluminizing pack is not materially contaminated by the masking layers, and can be reused for additional aluminizing without further precautions.

$Co_3Al$ or $Co_2Al$ or any of the other masking aluminides referred to in U.S. Pat. No. 3,801,357 can be used in place of the $Ni_3Al$ in the foregoing example, with somewhat poorer results. Although the cobalt aluminide masking powders give better results with cobalt-based substrates, those results are still not as good as the results obtained from the nickel aluminides.

The crusts are fairly brittle and can be readily removed from the blades by light blows of a hammer or even a wood club, or by blasting with an air-propelled stream of nickel shot. The crust fragments are discarded leaving the blade roots showing no aluminizing, and the balance of the blades with a 3 mil aluminized case.

The shell or crust formation is due to the fact that the nickel powder in the outermost masking layer undergoes so much aluminizing that these powder particles grow together. The dilution of the nickel with as much as four-thirds its weight of inert material such as alumina does not prevent such growing together, and neither is it prevented by the presence of the resin in the dipped masking composition. Such resin is completely driven off during the initial portion of the diffusion coating heat, but the relatively small amount of such resin would not significantly affect the results even if it were to survive the diffusion heat or were carbonized by that heat.

The diluted $Ni_3Al$ in the lower layers of masking does not aluminize sufficiently to cause shell or crust formation, even though those layers also contain a small amount of chromium that by itself would form a shell. Any metal-containing layer in contact with a workpiece should contain at least 25% inert non-metal such as the alumina, or kaolin, to assure that the metal of the layer does not sinter to the workpiece, and such dilution also keeps the $Ni_3Al$ from forming a shell or crust.

On the other hand, other aluminizable powders that are essentially inert to the workpiece but form shells, can be used in place of or in addition to the nickel powder in the shell-forming layers. $Cr_2O_3$ is another such shell-forming material, apparently undergoing some conversion to aluminized metallic chromium. Being less expensive than nickel, $Cr_2O_3$ is particularly desirable for use where masking expenses are to be minimized. Mixtures of nickel and $Cr_2O_3$ can be used with an effectiveness corresponding to that of each individually and indeed a small amount, such as 5%, of $Ni_3Al$ can be mixed with the nickel or the $Cr_2O_3$ without detracting significantly from the results.

All diluents can be omitted from the shell-forming layers, if desired, but his makes it more important to be sure that at least the minimum effective amount of shell-forming layer is applied. In undiluted condition only about 100 milligrams per square centimeter of nickel or $Cr_2O_3$ is needed, and the presence of the resin adds so little to the shell-forming layer that it has no significant effect on the amount of shell-forming layer needed. Layers deposited from undiluted $Cr_2O_3$ suspended in a resin solution, tend to crack on drying, whereas there is no such cracking when the $Cr_2O_3$ is diluted with at least about ¼ its weight of $Al_2O_3$ or other diluent. When inert solid diluent such as alumina, resin or even $Ni_3Al$ is used with nickel powder, such diluent is preferably not over about 50% by weight of the nickel in the sheath-forming layer. The resin content is preferably not over about 4% of the weight of the layer.

The resin in the outer layers acts to keep the masking layers from rubbing off onto or into the diffusion coating pack during the packing. Thus a stratum of nickel powder, with or without alumina, can be applied over the $Ni_3Al$-chromium-resin lower masking layers as by rotating the blades coated with those masking layers in a falling stream of powdered nickel so that falling powder particles adhere to the resin-containing lower masking layers. This is however not nearly as simple as the application of the outer masking layers by dipping, its uniformity is not as good, and some of the falling powder so adhered tends to rub off when the workpieces are handled and when the diffusion coating pack is poured over them.

After the first dip or two to apply resin-containing masking layers, some or all subsequent dips can be effected in resin-free suspensions of the coating materials in a solvent that dissolves the resin in the previously applied layers. Inasmuch as coating syspensions entirely free of resin are more difficult to maintain uniform, a little resin or other viscosity-increasing material can be added to such dispersions to reduce the settling rate of the dispersed powders.

It is also helpful to use a combination of shell-forming masking layers in which some are of the type that depend on the presence of nickel powder, and others are of the type that depend on the presence of $Cr_2O_3$ powder. Thus it is particularly desirable for aluminizings that are effected at about 2000° F. or higher, for the shell-forming combination of layers to have the lowermost such layers based on $Cr_2O_3$ and built up to at least about 300 milligrams per square centimeter, while the uppermost are based on nickel powder and are also built up to at least about 300 milligrams per square centimeter. It is not desirable for the $Cr_2O_3$ layers to be in contact with the substrate metal.

While other resins and solvents can be used to make the masking layers, the acrylic resins are preferred and poly(ethylmethacrylate) is particularly preferred because it gives such good dip coatings and clean products. Methyl chloroform is also a particularly preferred solvent inasmuch as it has the desired solvent action combined with good evaporation characteristics and low-use hazard. Some acrylic co-polymers are not sufficiently soluble in methyl chloroform, and for such polymers acetone or methyl ethyl ketone or methylen chloride can be used as the solvent. Any other resin that forms a cohesive film can be used, even wax, so long as it does not contribute contamination as by silicon present in silicone resins.

The composition of the depletion-reducing masking mixture can vary in the manner descirbed in U.S. Pat. No. 3,801,357. Thus, the aluminide can be nickel or cobalt aluminide containing between ¼ and ¾ atom of aluminum for every atom of nickel or cobalt, the inert particles can range from about ¼ to about ⅔ of this mixture by weight, and the chromium content can range from about ¼ to about 3% of this mixture by weight.

The foregoing masking is very effective to prevent the aluminizing of the masked surfaces. It also serves to mask against chromizing. The following example demonstrates a very effective chromizing combined with a masked aluminizing.

EXAMPLE V

A batch of first stage PWA 1455 blades for the hot section of a jet engine are cleaned by degreasing in trichloroethylene and then lightly blasting with 220 grit alumina propelled by an air jet at 30 psig. The blades so cleaned are embedded in the following pack, all percentages being by weight Powdered chromium: 1.2%
Powdered nickel: 2.4%
Powdered aluminum: 0.37%
Powdered alumina: 96.03%.

All of the powders were minus 325 mesh, their particle sizes ranging from about 20 to about 50 microns, and the mixture well homogenized with repeated siftings, then further mixed with ½% $NH_4Cl$ and ½% $MgCl_2$ and placed in a chromized steel retort before the blades are packed. The packed retort was then covered by an outer retort as described and illustrated in U.S. Pat. No. 3,785,854, care being taken that the outer retort has no leaks and is well sealed. The atmosphere in the outer retort is displaced by a stream of argon introduced through an inlet conduit opening near the bottom of the interior of the outer retort and exited through an outlet conduit opening near the top of the interior of the outer retort. Heating of the retort is initiated and the flow of argon maintained through the entire heat at a rate that assures essentially no entrance of air or moisture into the interior of the retorts. Where the outer retort has no leaks, an argon flow of about 5 standard cubic feet per hour is adequate.

The pack is held at 1900 to 1950° F. for 30 hours after which heating was terminated and the retorts permitted to cool, the argon stream being maintained. The retorts can be opened when the pack temperature cools to about 300° F., the blades unpacked, cleaned with a blast of air, and washed with water.

The blades have a very good chromized case 0.6 to 1.2 mils in depth, with no alphachrome and no objectionable oxide increase seen on metallographic examination.

The foregoing chromizing pack is used without a breakin heat, and has so little metal content that it can be discarded after a single use. If desired, its metal content can be salvaged as by pouring a stream of the used pack through a horizontally moving air stream which deflects away the lighter particles, permitting the metal particles to be collected.

The pack of Example V can be modified by incorporating in it about 0.1% magnesium. Chromized cases produced by a pack so modified have even less undesirable oxide visible on metallographic examination, and are of particularly high quality.

In general the pack of Example V can have a chromium content of from about 0.6 to about 2%, a nickel content from about ½ to about 3 times the chromium content, and an aluminum content about 1/10 to about ⅓ the chromium content. The argon atmosphere of that example can be replaced in whole or in part by helium, neon or other inert gas or mixtures thereof. Other inert diluents like kaolin can be substituted for the alumina in its pack.

The used diffusion coating packs of Example V contain a small amount of nickel-aluminum-chromium alloy and can be utilized as masking mixtures in low-temperature aluminizing, that is aluminizing conducted at not over about 1400° F. Thus the used pack can be mixed with 1/5 its weight of a 6% solution of poly(ethylmethacrylate) and the mixture applied by dipping over the roots of the blades chromized in Example V, to build up a coating weighing 500 milligrams per square centimeter. The masked blades are then embedded in the following powder pack, the percentages being by weight:

Alumina: 85%
Aluminum-silicon alloy (88% Al): 15% to which is added ½% $NH_4Cl$.

A coating heat in hydrogen with a 30 minute hold at 1350° F. deposits a 10 milligram per square centimeter coating over all unmasked surfaces. The blades are then removed from the pack, the masking mixture brushed off, and then heated in hydrogen having a minus 35° F. dew point for 4 hours at 1975° F. to diffuse the aluminum coatings into the surfaces. They are then rapidly air cooled to below 1000° F., aged for 10 hours at 1600 to 1650° F. and again rapidly air cooled to give blades ready for use with roots only chromized and with their airfoil surfaces chromized and then aluminized.

The combination of pack coating followed by a subsequent diffusion outside the pack is also helpful to provide a combination of two diffusion layers, one richer than the other.

As pointed out above, a particularly desirable masking technique involves the coating of the portions to be masked with at least one layer of a dispersion of finely divided depletion-reducing masking solid and resin in a volatile solvent, evaporating off sufficient solvent to set the coating, applying over the set coating at least one stratum of finely divided non-contaminating solid particles that upon aluminizing become coherently held together to form a secure masking sheath. It is also helpful to have the masked surface only in contact with an essentially inert layer such as inert diluent, or inert diluent mixed with a small amount, not over about 5% of depletion-preventing material such as powdered chromium. This depletion-preventing material helps keep chromium and other key alloying ingredients of the masked surface from diffusing out of that surface. Such as essentially inert surface-contacting layer is also helpful in the masking of aluminum diffusions that are conducted at temperatures as low as 1100° F.

The most elaborate masking arrangement of the present invention uses a three-layer masking combination in which the workpiece-contacting layer is of the essentially inert type, the next layer of the masking type, and the outermost layer of the sheath-forming type. Nickel aluminides present in any masking layer other than a sheath-forming layer, should have no more than about 3 atoms of aluminum for every four atoms of nickel.

A kit of chemicals for such combination can have a container holding a quantity of inert layer mixture, in addition to containers, holding mixtures for the other layers and a container for the resin solution, etc.

To make the masking layers easier to apply, it is helpful to add to the resin solution a little long-chain-hydrocarbon acid such as stearic acid that helps keep the particles of the masking composition dispersed in the volatilizable organic solvent in which they are suspended. As little as about 0.1% of such dispersing aid based on the total weight of the suspension, is enough to impart very good flowability so that the painting, or even dipping of the workpieces, is simpler and produces a more uniform masking layer. However dispersing aid concentrations of at least about 0.3% to about 0.5% are preferred, and as much as 1% can be effectively used.

Hydrocarbon chain lengths as short as 12 carbons and as long as 50 carbons or more are suitable for the dispersing aid. Thus lauric acid, myristic acid, oleic acid, and even copolymers of ethylene and acrylic acid, are effective. The dispersing aid should also be soluble in the solvent in which the masking composition is suspended.

The effectiveness of the dispersing aid is increased by also dissolving in the suspension a small amount of a surface-active agent, preferably a low-foaming non-ionic surface-active agent such as polyethoxy ether of a linear primary alcohol like cetyl alcohol, or of an alkyl phenol. Only about 0.1% of surface-active agent is all that is needed. It should be noted in this connection that the surface active agent when added without the long-chain-hydrocarbon acid, has substantially no effect on the masking suspension.

As noted, the masking compositions of the present invention can be used to prevent chromizing or to prevent aluminizing. The nickel and/or nickel aluminide in the masking layers combines with either chromium or aluminum or both and in this way prevents significant penetration of either of these metals to the workpiece surface on which the masking is applied.

The essentially inert layer of the masking combination need only weigh about ⅓ gram per square centimeter to improve the masking action by preventing roughening of the workpiece surface being masked. That layer can also weigh as much as about 2 grams per square centimeter, and can be composed of inert materials such as alumina, kaolin or MgO. The presence of about ⅓ to about 5% chromium metal in the essentially inert layer or in the layer above it, contributes a strong depletion-reducing effect.

The following illustrates a more elaborate masking technique.

EXAMPLE VI

A group of hot section turbine engine blades of U-520 alloy (0.05% C, 19% Cr, 12% Co, 6% MO, 1% W, 3% Ti, 2% Al, 0.005% B, the balance Ni) have their roots masked by dipped coating of three superimposed layers as follows:

first layer—a slurry of 2300 grams of 10 to 20 micron particles of alumina in 1300 grams (1000 cc) of a 7% solution of poly(ethylmethacrylate) in methyl chloroform containing 0.5% stearic acid. Three dips are used to provide a layer containing about 350 milligrams of non-volatiles per square centimeter of surface, and the layer is then permitted to dry by exposure to the atmosphere for about 20 seconds.

second layer—a slurry of 20 to 50 micron particles of $Ni_3Al$, similarly sized particles of Cr and 10 to 20 micron particles of alumina in the foregoing methyl chloroform solution or resin and stearic acid. The slurry contains 50 grams $Ni_3Al$, 5 grams Cr and 45 grams alumina for every 50 cc. of the foregoing solution, and two dips are used to provide about 400 milligrams of non-volatiles per square centimeter of surface. This layer is then permitted to dry.

third layer—a slurry of 20 to 50 micron particles of Ni, similarly sized particles of $Ni_3Al$ and 10 to 20 micron particles of alumina, suspended in the foregoing methyl chloroform solution of resin and stearic acid. The slurry contains 75 grams Ni, 13 grams $Ni_3Al$ and 12 grams $Al_2O_3$ for every 33 cc. of the foregoing solution, and it brushed on to deposit a layer thickness containing about 600 milligrams of non-volatiles per square centimeter of surface. The resulting layer is also permitted to dry.

The slurries are shaken before dipping and before the brushes used for brushing are dipped into them. A little shaking keeps the slurries well dispersed for the few minutes needed to do the dipping or brushing, and each brush stroke applies a uniform slurry stratum that can be built up to the desired total layer thickness by an overlying brush stroke or two. Expert brush manipulation is not necessary.

The blades with the dried three-layer masking on their roots are then diffusion aluminized, and even at aluminizing temperatures as low as 1700° F. such combination forms the hard shell that remains in place and keeps the masking from significantly contaminating the surrounding diffusion-coating pack. The masking is in the form of a hard crack-free shell locked around each blade root. Striking this shell with a wooden mallet or rod breaks the shell into small pieces that do not adhere to the workpiece, and drop off revealing a smooth bright root surface free of diffusion coating. The balance of the blade shows a good diffusion case 4 mils deep.

Such hard shell protection is also formed when the first of the three masking layers, that is the essentially inert layer, is omitted, but the masked workpiece surface is then apt to be not quite as smooth and bright, particularly when the diffusion coating is effected at very high temperatures. With or without the essentially inert layer, at least about 50 milligrams of $Ni_3Al$ or similar nickel aluminide per square centimeter of masked surface assures the most effective masking, and this can be applied with or without the metallic chromium, and with or without the alumina or other inert diluent in the masking layer. When used without the chromium and without the foregoing first layer, some loss of chromium takes place from masked superalloy surfaces. Without its inert diluent the masking layer becomes more expensive unless its thickness is reduced so that more care is needed to assure its proper application.

In general, a slurry used to apply a masking layer should have at least about 20 volume percent and up to about 70 volume percent suspended solids.

For diffusin aluminizing at temperatures below about 1100° F. or diffusion chromizing at temperatures below 1900° F., masking is very effectively provided without the first layer and without significant roughening of the masked surface. The small amount of roughening produced when aluminizing at temperatures as high as 1500° F. can frequently be tolerated. When masking workpiece surfaces of cobalt or cobalt-base alloys, cobalt aluminides can be used in place of nickel aluminides. However the foregoing three-layer or two-layer masking is also effective when diffusion chromizing plain carbon and low alloy steels.

In general, the masking layer should contain powdered nickel or powdered nickel aluminide or powdered cobalt aluminide, preferably diluted so that it constitutes up to about 90% of the layer, and at least about 25% of the layer, by weight. However, for masking superalloys, where depletion is to be avoided, elemental nickel should not be used in a layer contacting the masked surface or having only an essentially inert layer between it and the masked surface. In such use the masking ingredient should be a nickel or cobalt aluminide having between ⅛ and ¾ atom of aluminum for every atom of nickel or cobalt.

Similarly a sheath-forming layer can have a nickel or $Cr_2O_3$ content of from about 50 to about 100%, and when it contains nickel can also contain aluminum in an amount up to equiatomic with the nickel.

The foregoing percentages do not take into account the resin bonding agent and the like that holds the layers in place but is driven off during the diffusion coating.

The second of the masking layers of Example VI can be omitted and only the first and third layers used when masking against aluminizing and particularly when aluminizing stainless or low alloy steels.

The sheath-forming layer can be used as a very effective mask without any other helping layers, when aluminizing at temperatures below 1100° F. Sheath formation seems to be caused by the sintering together of the nickel particles in the third masking layer, under the influence of the diffusion atmosphere which causes diffusing metal to diffuse into the nickel of these particles. These particles thus grow in size. The $Cr_2O_3$ particles appear to form some chromium metal that becomes aluminized and sinters to a sheath.

Sheath formation can also be effected by adding to the sheath-forming layer a metal powder like aluminum the particles of which sinter to the nickel particles. Excessive addition is to be avoided to keep the added metal from contaminating the workpiece. Thus an aluminum addition of this type should contribute no more than about one atom of aluminum for every atom of nickel. As little as one one-hundredth of that proportion of aluminum helps the sheath formation, particularly where only a light diffusion is being performed.

The sheath-forming layer can be used to lock masking mixtures about a workpiece surface by partially or completely enveloping that surface. However such sheath formation will also securely hold a masking mixture against a portion of a flat or concave workpiece surface, particularly when such a combination is embedded in a powder pack in a diffusion coating retort.

Other inert diluents such as kaolin or MgO can be substituted for some or all the alumina in each of the foregoing formulations.

Omitting the stearic acid from the slurries used to apply the masking layers makes it more difficult to keep the slurries uniformly suspended and calls for the slurries to be shaken frequently to reduce settling.

Using the first and/or second masking layers without the third layer causes the applied masking layer or layers to develop cracks and gaps during the diffusion heating as a result of the thermal driving off of the binder resin. This causes the masking to be unreliable.

Omitting the nickel from the outermost of the three layers keeps it from forming the desired protective shell, unless the omitted nickel is replaced by $Cr_2O_3$. The remaining ingredients of the outermost layer make it more generally effective and easier to apply, but are not essential.

The substitution of other acrylic resins such as poly (ethyl acrylate) or similar binder resins for the poly (ethyl methacrylate) of Example VI does not materially change the results. Other solvents such as toluene can also be substituted for the methyl chloroform, but the methyl chloroform has a combination of non-flammability, volatility and lack of health hazard, that makes it particularly desirable.

The outermost or sheath-forming layer of the masking combination makes a very effective retaining or securing means that assures the locking of other types of layers beneath it onto the workpiece surface through the coating heat. The same securing action can be used to hold a slurry coating layer instead of a masking layer onto the workpiece. This is illustrated in the following example and makes it unnecessary to have the workpiece embedded in a coating pack.

EXAMPLE VII

A 5-foot length of steam generator high pressure tubing of Croloy alloy (1.9 to 2.6% Cr, 0.97 to 1.13% Mo, 0.15% C, balance essentially iron) having a ¾ inch bore and a ½ inch wall was thoroughly cleaned inside and out, and had its bore filled with a chromizing pack composed of a previously broken-in mixture of 10% chromium powder the particle sizes of which range from about 10 to about 20 microns, and
90% tabular alumina granules having a particle size ranging from about 100 to about 300 microns to which mixture was added ½% $NH_4Cl$ granules as an activator. The breaking-in was effected by a mixture of the foregoing three ingredients in a retort in the absence of a workpiece, to 1800–1850° F. for 10 hours under hydrogen. The tube so filled had its ends capped with 1010 steel caps frictionally fitted over the tube ends so as to provide semi-gas-tight covers.

The outside surface of the tube was then painted with the following layers in succession, drying the first layer for a few minutes before applying the second.

first layer—600 grams of a previously broken-in mixture of 45% Cr, 45% alumina and 10% Al, to which ½% $NH_4Cl$ is added before as well as after break-in as described in U.S. Pat. No. 3,801,357, suspended in 200 cc of methyl chloroform solution containing 7 weight percent of a copolymer of 70% ethyl and 30% methyl methacrylates, 0.5 weight percent stearic acid and 0.1 weight percent cetyl ethyl of decaethoxy ethanol. Four applications of this mixture are made with intervening drying to build the nonvolatile coating to 1200 milligrams per square centimeter of tube surface.

second layer—600 grams of a mixture of 68.5% Ni powder and 31.5% Al powder, dispersed in 150 cc of above methyl chloroform solution. The metals of this slurry were not pre-fired, and only two applications of this slurry were made to provide a non-volatile coating weight of about half that of the first layer.

The tube so prepared was placed in a tubular retort of a diffusion coating furnace assembly having inlet and outlet connections for a hydrogen-blanketing as in U.S. Pat. No. 3,801,357 and then subjected to a diffusion coating heat of 1800° F. for 10 hours. After cooldown at the end of the heat, the tube end caps were removed, the pack in the tube bore poured out, and the sheath around the exterior of the tube broken off and removed. The interior of the tube was effectively chromized with a case 1.8 to 2.3 mils thick, and the outside of the tube aluminized with a case about 24 mils thick.

The chromized case included an outer portion about 0.3 mil thick rich in chromium carbide, and an inner portion of columnar chromized structure. This case is particularly effective in reducing erosion of the internal tube surface by rapidly moving high pressure steam.

The aluminized outer surface prolongs the life of the tube in a coal- or oil-fired furnace where it is subjected to combustion atmospheres at temperatures as high as about 1000° F.

The internal pack is a highly fluent composition that is easily poured into place before the heat, and is readily removed afterwards, using a minimum of mechanical poking and the like. Such a pack is particularly desirable for packing of cramped recesses in the interior or workpieces, such as in the narrow bores described above, or in hollow jet engine blades, or the like.

The noted fluency is brought about because the alumina granules, which are crushed from alumina which has been melted and solidified, are quite fluent and show a flow angle of about 45 degrees. This is the angle of incline (measured from the horizontal) of a cone made by pouring a stream of the granules onto one spot to build up a cone. The fluency can be increased by selecting aluminas or other inert particles having an even smaller flow angle. Thus alumina microspheres having particles sized about 100 to about 500 microns are exceptionally fluent. Tabular alumina, which can be made by sintering alumina powder and then crushing, is also fluent, and is preferred because it tamps in place better and then during the diffusion coating does not shrink from the surface against which it is tamped.

The pack need only have about ½ its volume of any of the foregoing fluent materials. Thus the chromium particles by themselves need not be fluent at all, and will provide a suitable fluent pack when ½ of the pack is constituted by the fluent granules or microspheres. Similarly non-fluent alumina or other non-fluent inert material can be present in the pack with or without non-fluent chromium powder, without detracting significantly from the fluency provided by the foregoing volume of fluent material.

The fluent diffusion coating packs are also highly beneficial for use in chromizing bent small-bore tubing. Thus for some steam-generating arrangements lengths of steam-generating tubes have one end bent back 180 degrees to form cane-shaped units which can have their ends welded to additional lengths to form a continuous furnace tube assembly. The packing of the bores of such "canes" for diffusion coating, and the subsequent pack removal after coating, is greatly simplified by the use of fluent packs.

Fluent packs are very helpful when the workpiece being coated has a portion of its surface masked to prevent coating there. For such masking the shell-forming masking materials are highly desirable, and the fluent coating pack makes it easier to recover the masked workpiece at the completion of the coating operation with their masking intact. Little or no mechanical working of the fluent pack is needed to remove it from the retort and thus expose the masked workpieces. Thus a used fluent pack is readily removed from the interior of a narrow pipe, for instance, by pushing a narrower tube into the pipe bore and blowing air through the tube as it moves into that bore.

Fluent coating packs also do not require much tamping into place and this reduces the chances of disturbing the masking when masked workpieces are loaded into a retort at the beginning of a coating operation.

The external surfaces of boiler tubing are also made more resistant to corrosion as a result of the aluminizing or the chromizing described above, even the minor chromizing effected when only the interior of such a tube is packed with the diffusion chromizing mix.

As pointed out, the shell-forming layer used to hold a slurry coating in place where there is not much of an aluminizing or chromizing atmosphere, contains non-contaminating materials that sinter together under coating conditions. Thus nickel and aluminum powders smaller than about 500 microns in size and in an atom proportion from about 1 : 0.9 to about 1 : 1.1 are very effective. Chromium can be substituted for the nickel in such a mixture. Because of the non-contaminating character, a diffusion coating pack will not be ruined in the event a small amount of the masking materials should inadvertently become mixed into it.

Fluent diffusion coating packs are also very helpful even when they are used without insertion into cramped spaces. Thus in diffusion coating of the outer surfaces of turbine vanes or blades in the standard arrangements such as shown in U.S. Pat. No. 3,764,371 or in glass-sealed retorts as in U.S. Pat. No. 2,844,273, a fluent pack is simpler to load into a retort, simpler to embed the work in and far easier to remove from the retort after the coating heat is completed. For such use the fluent particles can have repose angles of as much as 55 degrees, and can constitute as little as about 40% of the pack by volume, although the greater fluency of the packs having at least half of the particles with the 45 degree repose angle, are preferred.

It is not necessary to diffusion coat the external surfaces of such tubes or to diffusion coat those external surfaces with aluminum. The internal bores of such tubes can be chromized for instance without the use of a covering layer on their exterior. Such chromizing in the retort arrangement described in Example V will produce a distinct outer chromized case in addition to the above-described internal case, but the outer case will generally not show the carbide stratum and will have less chromium pick-up.

The foregoing inner and outer coatings can be applied to tubes as long as 40 feet or more in length, whether those tubes be straight or cane-shaped. For such long tubes it is desirable to effect the diffusion coating uniformly along the tube lengths, and to this end the diffusion coating temperature along the length of the tube can be closely controlled. Thus a plurality of the tubes each with its bore packed and its ends capped can be inserted lengthwise in a tubular open-ended retort sufficiently narrow to make a snug container for the tubes. One or more of the tubes is also fitted with a number of thermocouples on its exterior and distributed along its length. The retort so loaded can then be inserted in a furnace having a number of gas burner rings spaced along the retort's length, each ring encircling the retort. Only one end of the retort need be open, and that end can be sealed with a head that has a number of passageways. Some of these passageways are used for the passage of thermocouple connection wires, and two can be used as inlet and outlet respectively, for a bathing gas such as hydrogen.

The operation of the burner rings is then adjusted to bring all the thermocouples to the desired temperature. Should there be a temperature variation among the thermocouples, individual burners can be further adjusted. In this way a cool thermocouple can have its temperature brought up by turning up the nearest burner or burners, and conversely a hot one can have its temperature reduced by turning down the nearest burner or burners. These control functions can be effected manually or automatically to maintain the temperature of the packed tubes within a range of about 25° F. along their entire lengths.

Cane-shaped tubes can be handled the same way. Also an argon washing atmosphere can be maintained throughout most or all of the diffusion coating of Example without significantly different results. Because of its expense, the flow of argon should be reduced to a very small rate by back pressuring it equivalent to 1 to 2 inches of water. Alternatively, that diffusion can be effected in a glass-sealed retort with an autogenously generated atmosphere.

Any of these retort and retort atmosphere arrangements can also be used with slurry coatings or conventional packs to aluminize nickel, platinum and other metals for the purpose of improving their catalytic activity as described in U.S. Pat. No. 3,867,184. Part of the metal surface can also be masked as by the sheath-forming layer directly applied to those parts.

A very effective depletion-preventing slurry is essentially a mixture in the following proportions, of $Ni_3Al$ powder: 40 to 60 grams
Cr powder: 4 to 6 grams
alumina powder: 40 to 60 grams in 50 cc of a 5 to 10% by weight solution of poly(ethylmethacrylate) in methyl chloroform. The powders preferably have particle sizes no greater than about 50 microns, and any other inert powder, such as kaolin, can be used in place of the alumina. About 200 milligrams of non-volatiles per square centimeter are applied from a single dip or a single brushing in such a dispersion, and the dips or brushings repeated to build up the non-volatile weight to about 400 milligrams per square centimeter. For low temperature diffusion coating as with aluminum, the chromium content of the solids in the above slurry can be reduced and can be as low as 1% of all the solids.

The grey appearnace of the foregoing mixtures as applied to the substrates, are sometimes difficult to visually distinquish on the substrate. Should it be desirable to make them stand out with more contrast, the mixture can be given some different color, as by substituting dark green $Cr_2O_3$ powder for some or all of the alumina. Substituting $Cr_2O_3$ for as little as one-twelfth of the alumina makes a distinct improvement in the distinguishability of the applied powder-resin layer.

Some aluminas are colored reddish and they can also be used for increasing the contrast in the appearance of the powder resin layer. If desired a little dye can be added to the dispersion for the same purpose. Where two or more different types of layers are built up to make a masking combination, each different type of layer can be given a different color to make them more readily distinguishable.

The masking practiced on the chromized product of Example V can also be effecting with a masking composition having the following formulation, the percentages being by weight:

Calcined alumina—less than 200 mesh: 25%
Powdered nickel—less than 200 mesh: 56¼%
Powdered prefired mixture of:
  49.2% alumina powder
  42.8% nickel powder
  6.5% aluminum powder
  1.5% chromium powder balance.

The prefired mixture is prepared by prefiring the specified materials in a hydrogen atmosphere at a temperature of 1800° F. for 4 hours, cooling the fired product, and then powdering it to from about minus 100 to about minus 200 mesh size.

The foregoing masking formulation is best slurried into a resin solution as in Example VI and applied by dipping or brushing.

Alternatively the masking can be accomplished by a two-layer combination in which the first layer is deposited from a similar slurry of the above-described prefired mixture, and an overlying layer deposited froma slurry of that prefired mixture mixed with three times its weight of the powdered nickel. The lower layer can weigh as little as 100 milligrams per square centimeter and the upper layer as little as 200 milligrams per square centimeter.

The solvent used in the resin solution can contain water, although water is not rapidly vaporizable except at ambient temperatures at least as high as about 30° C., preferably 35° C. Water can be the sole solvent, in which case the resin should be a water-soluble one like polyacrylic acid.

Chloroform can also be used as part or all of the solvent, although this makes the solvent more readily volatile and is preferred when working at low ambient temperatures such as 10° C. or lower. Chloroform is considered not as low a health hazard as methyl chloroform.

The various layers in the masking of the present invention can also be applied by spraying. For such application it is preferred to formulate the slurries from which the layers are deposited so that these slurries contain only about 20 to 30 volume percent of suspended solids, or even less. An air stream propelled at a pressure of about 30 pounds per square inch will adequately spray such slurries with internal mix or external mix spray guns, using nozzles and slurry-carrying conduits wide enough to keep from becoming obstructed by the suspended solids.

For spray application it is also preferred to have the solid particles suspended in the slurry to be sprayed, not over about 40 microns in size.

Where a sprayed-on layer should have a sharp edge as for example to accurately define its boundary, it is best sprayed on with the help of a cut-out stencil type mask made of a material like teflon or polyethylene, that is resistant to and preferably not wet by the solvents in the sprayed-on slurry. A sheet of such a stencil mask can be wrapped around a cylindrical work surface, or pressed against a flat or gently curved work surface, and the sprayed-on masking layer or layers applied to the cut-out portion or portions of the stencil. It is generally not necessary to have the outer masking layers cover the edges of the lower layers, but such covering can be effected by a separate brushing of the appropriate slurry on those edges, or by using stencil masks with slightly larger cut-outs for the outer layers.

Powdered iron is almost as effective as powdered nickel in forming relatively brittle protective sheaths and less costly, and can be substituted for about half or more of the powdered nickel. Where a protective sheath is deposited from a slurry half of whose solids by weight are inert filler, powdered iron can be used up to an amount about equal the weight of the powdered nickel. With lower proportions of inert filler the iron to nickel proportion can be raised up to about 2:1 by weight. Powdered iron is not considered a contaminant for coating on workpieces that contain at least about 25% iron, and when coating workpieces containing less than 1% iron it is preferred to hold the powdered iron content of sheath-forming solids to not over about 10% by weight.

Simple masking with iron powder can be effected, for example, on chain saw cutter blades or other cutting edges that are sugjected to substantial wear and it is desired to maintain cutting effectiveness notwithstanding the wear. On this basis the cutting edge can be in the form of a narrow edge face on a steel flange, one surface of the flange being very hard and the opposite surface of the flange being relatively soft. The edge face connects those two surfaces and is preferably tapered so that the edge of the harder surface projects out further than the edge of the softer surface, thus providing good cutting action. During use the edge face wears with the softer portion wearing faster than the harder portion so that the cutting effectiveness of the edge face is maintained quite well.

According to the present invention the cutter blades can be made of carbon steel and can be diffusion chromized on one surface to harden it. The opposite surface is masked as by the iron powder layer referred to above, slurrying it in a solution of a resin binder. Such a slurry can be readily applied, with a medicine dropper, for example, to the desired surface of a small blade, and after such a coating layer sets the coated blade, can be chromized to harden its uncoated surface.

For chromizing at low temperatures, such as 1300° F. to 1400° F., the masking layer need not contain any inert diluent, but at higher temperatures inert diluent such as alumina or kaolin will keep the iron powder from sintering to the cutters. A mixture of iron powder and alumina in which the alumina content is as high as 90% is suitable for masking a modest chromizing. This is illustrated in the following example:

EXAMPLE VIII

A quantity of chain saw cutters made of high carbon steel having the formulation 0.65% carbon
0.3% manganese
0.75% nickel
0.5% chromium
0.15% molybdenum
balance essentially iron are prepared by cleaning and then have their under surfaces individually coated with a slurry of a mixture of 80% alumina and 20% iron powder, suspended in a methyl chloroform solution of 2% poly(ethyl methacrylate) and 0.1% stearic acid. The coating weight of the dried coating is about 100 milligrams per square centimeter.

The resulting cutters are embedded in a chromizing mixture corresponding to that used for the internal chromizing in Example VII but using non-fluent calcined 360 mesh alumina powder in place of the tabular alumina. The diffusion coating pack so made, held in a retort, is subjected to a diffusion coating heat as in Example VII, the pack being held at 1600° F. for five hours.

After cooldown, the retort is opened and the cutters removed and cleaned. A blast of fine glass particles propelled by a strem of air from a 10 psig source removes the masking layer, and the resulting cutters have a 0.4 mil thick chromized case on the unmasked surfaces. The masked surfaces show much less chromizing as well as a greater degree of wear in use.

A fluent pack is not needed for such chromizing, but can be used, if desired. Should portions of the masking layers break off during handling and remain in the coating pack, no significant harm is done inasmuch as such an iron-contaminated pack can still be very effectively reused to chromize ferrous surfaces.

To keep from decarburizing carbon away from the carbon steel being chromized, the chromized temperature can be kept from exceeding about 1850° F., and is preferably not over about 1750° F. Cutter blades made of type 416 stainless steel can also be treated in the foregoing manner with corresponding results.

The diffusion coating of nickel or DS nickel with chromium or aluminum can be correspondingly masked by a masking layer of nickel powder, preferably containing about 20 to about 90% inert diluent to keep it from sintering to the surface being masked. Other substrates can likewise be masked by a powdered masking layer having the same or essentially the same composition as the substrate. Some substrate ingredients such as carbon, silicon, manganese and aluminum generally do not have to be present in such masking layer to minimize loss of those ingredients from the substrate during a diffusion heat.

The foregoing maskings can also be used when diffusion coating is effected as a gas-phase treatment, such as described in parent Applications Ser. Nos. 479,211, 230,333 and 89,949, as well as in U.S. Pat. No. 4,148,275. However the presence of a large quantity of resin-containing masking mixtures in a diffusion-coating retort can detract from the quality and effectiveness of gas-phase coatings.

Accordingly, when conducting a masked gas-phase diffusion coating it is desirable to mask the workpieces by embedding the surfaces to be masked in a resin-free masking powder, as in parent U.S. Pat. Nos. 3,764,371 and 3,801,357. FIG. 5 shows such a technique.

In FIG. 5, a box-like diffusion coating retort 110 has its floor 112 covered with a layer of diffusion coating powder 116 as described in U.S. Pat. No. 4,347,267, the contents of which application are incorporated herein as though fully set forth.

Over the top of the powder is placed a group of jet engine blades 121, each having its root 126 embedded in a masking powder 128 held in a small cup-shaped steel container 129. The powder is tamped in well and will then hold the blade securely even though cup 129 is placed on its side and the blade axis extends horizontally. The cup preferably has a flat side on which it rests, so as to keep from rolling when the retort is tilted, or the cup can be embedded a short distance into powder layer 116.

A cover 136 is loosely fitted over the retort box 110, and the edges of the cover packed with asbestos fibers or rope to sharply limit gas flow into and out of the box past the cover. A perforated tube 114 can be positioned within or under floor layer 116 and led to the outside of the box so that a gas such as argon or hydrogen can be slowly introduced through the floor powder and escape past the cover.

Blades of B-1900 alloy so embedded in a nickel aluminide-chromium-alumina masking powder as described in U.S. Pat. No. 3,801,357, have their airfoil surfaces very effectively aluminized with the aluminizing mixture of Example 1 in U.S. Pat. No. 4,347,267, when held at 1800° F. to 1850° F. for eight hours, with a barely perceptable flow of hydrogen.

The same technique can be used with blades that have internal passageways. In the event it is important to have the passageway walls also effectively diffusion coated, those passageways are pre-filled with diffusion coating slurry or dry powder, as also described in U.S. Pat. No. 4,347,267. The passageway coatings can alternatively be diffusion coated by the technique described in U.S. Pat. No. 4,148,275.

Argon can be used in place of or in addition to hydrogen as the flushing gas, and the flow of gas can be completely eliminated in which case the retort can be placed within an outer retort through which an inert gas is slowly flushed. In the absence of injected gas, the diffusion coating formed is of the outward diffusion type, rather than the inward diffusion type, and outward diffusion type coatings are preferred in many cases. A discussion of such comparative diffusion coatings is contained in U.S. Pat. No. 4,347,267.

In stead of using an essentially completely inert gas like hydrogen or argon, a halide-containing gas can be injected through the tube 114, as by flowing such inert gas through a container holding heated aluminum chloride, before the gas is injected into the retort. Gas introduced this way carries along aluminum chloride vapors that help provide outward diffusion type of diffusion coatings.

Keeping the surfaces to be diffusion coated close to the powder layer 116, helps speed the coating operation and provides more desirable diffusion coatings. A three-inch spacing from that floor powder should not be exceeded, for such improved results. However surfaces spaced as much as eight inches from the floor receive acceptable diffusion coatings.

The cups 129 can be stood upright on the powder layer 116, or can be partially or completely embedded in that layer to hold workpieces elevated at any desired angle above that layer. Indeed the cups themselves can be omitted and pockets of masking powder provided in the floor layer. When cups are used they can be made of ordinary low-carbon steel, preferably pre-treated to diffusion coat their outer surfaces with the same metal which is to be used to diffusion coat the workpieces.

Powder-pack masking during a gas-phase diffusion coating is a particularly desirable and effective combination. The absence of resin enables the efficient and economical crowding of many workpieces in retorts and yields very uniform and complete coatings on the non-masked surfaces, regardless of the nature of the metal substrate and regardless of the metal being deposited on the substrate. Gas-phase aluminizing of powder-pack masked superalloys is exceptionally desirable.

The resin content of the resin-containing mixtures of Examples IV, VI and VII can be sharply reduced to enable crowding of workpieces in a retort without serious detraction from the resulting coating quality. A resin content not over about 1% by weight of the masking mixtures is a good limit for this purpose, and can also be observed in the preparation of the masking pastes. The effectiveness of the low-resin mixtures can be increased by also incorporating in those mixtures some inert inorganic binder such as bentonite, or using it in place of all the organic binder.

A resin like nitrocellulose that contains in its molecule all the oxygen needed to burn up the molecule, has the least effect on the quality of diffusion coatings.

The activation of an aluminized nickel surface by leaching with caustic, yields greater degrees of activity when the leaching is more vigorous. Thus, a nickel screen made of wires about 20 mils thick, after aluminizing at 850° F. for twelve hours can be leached for 1½ hours with a boiling solution of 200 grams NaOH in enough water to make 500 cc, to leave the nickel surface substantially more active than when leached for prolonged periods with 20% aqueous NaOH solution at 180° F.

Inasmuch as the initial action of the hot stronger caustic which boils at about 250° F. is very violent, the stronger caustic treatment can be started at lower temperatures such as room temperature, or can be preceded by a treatment with milder caustic. For example, a one-hour treatment with boiling 40% aqueous NaOH can be preceded by a one-hour treatment with 20% aqueous NaOH at 180° F.

Even better results are obtained by a final leaching in boiling 60% aqueous NaOH for one hour. KOH can be substituted for some or all of the NaOH in any of the leachings without significantly affecting the resulting activation.

When electrolyzing water in which an alkali like NaOH is dissolved to increase its conductivity, a nickel anode previously activated by aluminizing to give a 2-mil thick case followed by a one-hour treatment in boiling 60% or 70% NaOH, provides a much greater anodic current density than a corresponding anode in which the leaching was only with hot 20% aqueous caustic. Indeed, at low inter-electrode voltages as against an untreated pure nickel cathode, the anodic current density is increased as much as seven-fold. The foregoing anodes are preferably dipped into dilute hydrogen peroxide after the leach is completed, with or without an intervening rinse in hot or boiling water.

A somewhat smaller but still spectacular current density increase is obtained from boiling 40% aqueous NaOH leach for one hour.

In general the leaches with 50% or stronger caustic should not be extended so as to remove much of the aluminum at the interface between the aluminized case and the nickel core under it. Too much removal at that location can reduce the adhesion between the core and the leached case and cause the leached case to spall off. A one-third hour leach at about 200° F. is appropriate for cases as thin as 0.5 mil, but boiling 70% caustic should not be used for more than about 10 minutes unless the case is thicker than two mils. Preferred leaching is with about 30% to about 60% aqueous NaOH at temperatures from about 212° F. to about 300° F. for at least a half-hour, but not lone enough to loosen the leached layer.

The foregoing vigorous leachings also improve the cathodic current density when the leached nickel electrodes are used as cathodes, but here the current density increases are only effected at inter-electrode potentials greater than about 1.5 volts.

A 1.5 to 2 mil aluminized case applied on 430 stainless steel by powder pack diffusion below 1000° F. is preferably leached for not over about 1¾ hours when the leaching is effected at about 150 to about 190° F. with 10% to 30% caustic. Most preferably such leaching is for about 1 to about 1½ hours, particularly for use as an NOX-reducing catalyst with $NH_3$ in furnace and internal combustion engine exhausts. Thinner cases should be leached for proportional times. Leaching at lower temperatures, e.g., at 90° F., can be extended to about 3 hours.

When leached aluminized stainless steel screening is used for NOX removal, better results are obtained with the greatest degree of leaching, but the aluminized case should not be completely leached through. Some of the activated stainless steel stratum may slough off during the leaching, but this does not detract materially from the NOX-reducing effectiveness so long as the case is not completely leached through.

While anhydrous $AlCl_3$ is a very effective energizer for diffusion aluminizing at temperatures below about 1400° F., its sensitivity to moisture makes its use awkward. It can be replaced by anhydrous water-insoluble $CrCl_3$, as disclosed in parent Ser. No. 538,541, but that replacement is very high-priced in the current market.

According to the present invention there is used as such energizer a basic chromic halide that has been pre-treated to drive off liberatable water and also pre-treated to render it at least slightly acid. Any of the basic chromic chlorides can be used, after mixing with ⅛ to 10% its weight of $AlCl_3$ and heating of the mixture at 700° F. for at least about 4 hours at atmospheric pressure. The mixture is preferably kept out of contact with air, as by keeping it covered during at least the first hour of heating with an inert atmosphere such as argon.

The heating temperature can vary from about 600° F. to about 900° F. Under subatmospheric pressures from about 100 to 600 millimeters of mercury, the total heating time can be reduced to as little as about 2 hours.

The minor addition of the $AlCl_3$ keeps the heated product from becoming excessively basic. The mixture loses considerable weight as a result of the heating, and little or no aluminum compound can be detected in it after the firing is completed. However the fired product makes a very effective aluminizing energizer. For example it can be incorporated in a low temperature diffusion aluminizing pack in a proportion of from about ¼% to about 2% to give excellent aluminized cases that cause little or none of the etching generally produced when $AlCl_3$ is the energizer. Moreover essentially none of the chromium transfers from the energizer to the aluminized case.

A preferred low-temperature energizer is made by a five-hour firing under argon at atmospheric pressure, of the basic chloride $Cr_5(OH)_6Cl_9.12H_2O$ mixed with 1% $AlCl_3$ by weight. The resulting energizer can be used in place of the energizer in the aluminizing step of Example II in U.S. Pat. No. 3,948,687, or in similar low-temperature diffusion aluminizings where relatively pure or silicon-containing aluminum powder packs are used to aluminize workpieced embedded in them. Such pack aluminizings can be effected on any metallic workpiece including the steel foils and powders of Ser. No. 571,510. It appears that some of the metallic aluminum solid or vapor present in a hot aluminizing mixture reacts with the hot chromium compound in the pretreated energizer to liberate aluminum halides that accelerate the diffusion coating onto the workpiece without calling for awkward handling or humidity-free storage of the diffusion-coating materials.

Instead of some or all of the $AlCl_3$ used in the pretreating of the basic chromium chloride, other active halides such as aluminum bromide and titanium trichloride can be substituted. Also basic chromium bromides and iodides can be substituted for some or all of the basic chromium chlorides.

The aluminizing with any of the above described energizers can be used with a subsequent leaching to prepare pyrophoric foils'of the nickel or iron, as described above, and even to correspondingly prepare pyrophoric metal powder. Such pyrophoric powder can alternatively be prepared by leaching aluminum or zinc out of a crushed alloy of these metals with iron, nickel or the like. The resulting pyrophoricity can be used to trigger exothermic reactions to greatly increase the thermal output. Thus pyrophoric iron powder made from iron-aluminum alloy also containing as little as 2 to 6% boron, generates much more heat and reaches temperatures as high as 2000° F. Such powders can be mixed with other readily ignited materials of high heat output, as for example powdered magnesium, lithium, boron, aluminum, titanium, carbon, silicon, uranium—preferably depleted from U-235 separation, molybdenum, tungsten, tantalum, vanadium, thorium, zirconium, beryllium and osmium. The mixed powders can be held together with a small amount of binder or can be compressed into discs or the like, and should contain sufficient pyrophoric metal to heat all of the mixture to ignition, and at least about 50% by weight is preferred.

The powder can be compressed with the help of metal honeycombs or screens as described in U.S. patent application Ser. No. 643,782 filed July 17, 1984.

Such a pyrophoric powder or powder mixture can be used as a thermal decoy against heat-seeking missiles, as by projecting them into the air from a sealed container. They can for example be compressed or bonded into discs or rods and projected in that form. Such decoy materials can also be given radar chaff characteristics, as by inserting them into thin-walled aluminum or copper tubes about an inch long or longer - for example six to eight inches. A quantity of such powder having particles about 20 microns or less in size can be extruded with the help of a polyethylene or polystyrene binder into elongated rods about 7 to 15 mils thick, and the rods wrapped in a turn of aluminum foil ½ to 2 mils thick. The wrap can be held in place by the binder, using heat or solvent to cause it to adhere to the extruded rod or to a small overlap of the wrap. Cutting such a wrapped assembly into suitable lengths, preferably leaving the cut ends open so that air can get to the powder within the wrap, can complete the production, but care should be taken to conduct all of the steps while the powder is protected as by a film of water, from contact with oxygen.

Instead of or in addition to the open ends of the cut lengths, the wrap itself can be perforated to permit more ready access of air to the wrapped powder. On the other hand, such access can be hindered by increasing the proportion of binder to powder, and/or by impregnating the powder particles with colloidal inert particles as described in Ser. No. 281,405 or with slowly volatilized liquids as described in Ser. No. 571,510.

Pyrophoric particles having different delay times, e.g., from one second to 30 seconds, can be mixed with each other and with the ignitible substrates, to extend the burning times.

Preformed tubes can also be used to hold the pyrophoric powder. Such tubes can be extruded and then have their wall thickness reduced as by chemical milling.

As shown in the parent applications, Raney iron powders such as $FeAl_2$ and $FeAl_3$ are easily boronized by mixing with powdered boron and ammonium chloride, fluoride or borofluoride or the corresponding alkale metal salb, and heating at 750° to 1050° C. for 3 to 10 hours in an argon or hydrogen atmosphere. The powder particles are preferably smaller than 50 mesh, and the proportion of boron from about 2 to about 110% by weight of the iron in the Raney iron. The ammonium salts act as energizer or activator for the diffusion and so can be present in a concentration of about ¼ to about 2% by weight of the total mixture. Other halides and borohalides can be substituted for the ammonium borofluoride.

After the heat treatment is completed and the mixture cooled down, it is in the form of partly sintered-together powder particles that are easily crushed to a fine powder and washed with water to remove remaining energizer leaving a product powder in which each particle has been diffused into its surface. Where the diffusion heat treatment is sufficiently long and the particles sufficiently small, the boronizing penetrates throughout the depths of the particles.

Before or after the washing to remove the activator, the boronized particles are subjected to the action of aqueous caustic soda or caustic potash to dissolve out some of their aluminum content, leaving a boron-containing activated Raney iron powder. Such leaching also dissolves out any residual diffusion activator. The residual powder is pyrophoric like ordinary Raney iron powder, but liberates more pyrophoric heat and reaches higher temperatures. It can be preserved as by keeping it under water or other liquid so that it is out of contact with the air. For such preservation it is helpful to have stannite ion present in the leaching solution, as disclosed in parent U.S. Pat. No. 4,435,481, and even present in the protecting liquid. Less of the stannite is needed for protecting the powder, than is needed for protecting foils.

According to the present invention pyrophoric Raney iron particles, whether or not they contain diffused-in boron, can be safely stored in air, if they are first brought into good thermal contact with a heat sink at about 35° C. or less and while in such thermal contact exposing them to air or oxygen in such a way that the particles do not increase in temperature by more than about 5° C.

Where the particles are not over about 2 millimeters in size, they can be spread on a single-particle layer on a metal plate, preferably aluminum or copper, at least about 2 millimeters thick, as by pouring into such plate a slurry of the actively pyrophoric particles in water and then permitting the water to evaporate. A stream of air directed at the layer, as by a fan, greatly speeds the evaporation. The resulting particle layer can then remain on the plate exposed to air at 35° C. or less for a few minutes to assure that the water is completely evaporated off and the particles have all been stabilized.

Pyrophoric particles of any size can be similarly stabilized by contacting them with aqueous potassium nitrate for from 1 to 24 hours. At least about 5 grams per liter of such nitrate solution will provide the stabilization after about 20 hours of contact at room temperature. Other nitrates behave similarly, as do nitrites.

Stabilized by either of the foregoing techniques, the particles will not show pyrophoricity if kept in air at about 50° C. or less. However, when heated to about 100° C., they promptly begin reacting with air and go through a pyrophoric stage to completion. The heat thus generated and the maximum temperatures reached in such stage are slightly less than those obtained from unstabilized particles, but more than adequate for most pyrophoric uses. Some of the stabilized products will pyrophorically ignite when heated to temperatures of 90° C. or somewhat below.

To achieve the above-described stabilization the leached iron-boron-aluminum alloy should have at least about 25% boron. An alloy stabilized to 50° C. will show stability to about 70° C. when mixed with the $Ba(NO_3)_2$.

A stabilized pyrophoric, iron-aluminum-boron corresponding to $2FeB_2 \cdot 3AlB_2$ is magnetic and will remain stable even at 90° C. Such a pyrophoric alloy can be made by leaching with caustic soda an alloy of:

33.9 wt% Fe
33.3 wt% B
32.8 wt% Al
($FeB \cdot 2AlB_2$)

which alloy is not magnetic. Even without leaching, such high-boron alloy decomposes $Ba(NO_3)_2$ very effectively when both are 40 micron particles well mixed, and heated to ignition. A hot soldering iron will ignite the mixture or will more rapidly ignite a small amount of igniter mixture of 2 parts by weight stabilized pyrophoric iron powder, and 1 part by weight sodium chlorate powder placed over the $NO_2$-generating composition.

Such a reactive unleached iron-aluminum-boron alloy should have about 25% to 40% boron by weight and about 28% to about 50% aluminum by weight.

Stabilized pyrophoric iron particles containing 6% to 30% diffused-in boron by weight, can be mixed with five to seven times their weight of powdered anhydrous $Ba(NO_3)_2$ to form a composition that is stable at room temperature, but upon heating reacts to evolve copious quantities of $NO_2$. With less diffused-in boron, the reaction is more difficult to initiate and maintain, but the addition to such a less reactive composition of about 3% to about 10% powdered elemental boron and/or oxidizer such as sodium chlorate, makes its action positive and complete.

All the particles are preferably not over one millimeter in size. The stabilized pyrophoric particles can be as low as one-eighth the weight of the barium nitrate, and preferably no greater than about one-third that weight.

Powdered boron alone will react with $Ba(NO_3)_2$, when heated, and thus liberate $NO_2$, even when mixed in a proportion by weight of one part boron to 16 parts $Ba(NO_3)_2$. Such a mixture has low thermal conductivity, a characteristic that is improved by the use of pyrophoric metals. Non-pyrophoric metals such as zirconium or coorse iron or nickel powder can also be used.

Substituting anhydrous $Sr(NO_3)_2$ for the barium nitrate in the foregoing compositions gives similar but less vigorous results, even when the oxidizer content is raised to 15%. Anhydrous calcium nitrate produces still less vigorous compositions. Hydrated forms of the foregoing nitrates are somewhat less vigorous in their decomposition, as compared with anhydrous forms. Other nitrates such as ferric nitrate, ferrous nitrate, nickel nitrate, aluminum nitrate, copper nitrate, chromium nitrate, as well as the corresponding nitrites, are similarly decomposed, some with even more vigor than others, whether or not hydrated. Indeed, ferric nitrate in hydrated form can be very effectively decomposed by pyrophoric iron-boron alloy containing as little as 5% boron.

Up to about 15% of iron dust can be added to the foregoing compositions without detracting significantly from their effectiveness of the vigor of the reaction with $Ba(NO_3)_2$, but this reduces the volume of $NO_2$ generated. Such dust should have particles about 10 microns or less in size.

The foregoing $NO_2$-generated pyrophoric particles can be used without being stabilized, but then the compositions are required to be protected against contact with oxygen until the $NO_2$-generation is desired. Such protection can be provided by keeping the reactive compositions in a sealed argon-or nitrogen-filled frangible container that is broken when the $NO_2$ generation is to start. No pre-heating is needed. Such a frangible container can be made of glass or very brittle metal such as iron aluminide, and the breaking of the container can be assisted by a percussion cap or the like.

Pyrophoric nickel powder can be used in the foregoing composition in place of pyrophoric iron powder.

Magnesium powder should not be added to any of the foregoing powdered compositions inasmuch as such addition tends to render the compositions explosive. Thus a mixture by weight of four parts magnesium powder, two parts boron powder and 32 parts anhydrous barium nitrate powder, all particles being smaller than 100 microns, will upon heating violently detonate even if in an open container. Molar proportions of boron:magnesium:nitrate radical of 1:1.2:1.5 plus or minus 25% for each ingredient, are dangerous in this respect.

Boron powder alone will decompose $Ba(NO_3)_2$, and will decompose as much as 16 times its weight of such nitrate, but is difficult to ignite. Adding 5% by weight of pyrophoric Fe-B-Al alloy or even the above-noted active non-pyrophoric Fe-B-Al alloy simplifies the ignition.

Pyrophoric Fe-B-Al alloys containing less than about 4% Al will not do a good job of decomposing $Ba(NO_3)_2$ unless at least about 1% elemental B powder is added to the $NO_2$-generating mixture.

The boronized Raney iron particles of the present invention are also effective to decompose polytetrafluoroethylene resin and in the presence of a source of oxygen generate dangerous fluorine-containing gases. Thus, a mixture of powdered polytetrafluoroethylene with about one-eighth its weight of powdered sodium chlorate, and with about one-fourth its weight of powdered Raney iron in which the iron had been diffusion-alloyed with 6% boron, will react and generate large quantities of fluorine-containing gases. Similar results are obtained whether the Raney iron is stabilized or unstabilized, and even if it contains no boron except that when stabilized it will not begin the gas-generating reaction until it is heated to about 110° C.

The gas generation is made move vigorous by increasing the boron content of the Raney iron to about 20% or even higher, or by adding up to about 10% elemental finely divided boron to the resin-containing mixture.

Other oxidizers such as nitrate, nitritos, borno4 sodium perchlorate, manganese dioxide, sodium peroxide, sodium periodate, sodium iodate, sodium bismuthate and $CrO_3$ can be used. Where the resin is in the form of an open-celled foam weighing about 0.15 gram or less per cubic centimeter, no oxidizer is needed inasmuch as sufficient air will be present in the foam cells. The use of shredded foam in such compositions while keeping the compositions open to the air, permits the use of foams having densities as large as 0.2 gram per cubic centimeter, without extra oxidizer.

As noted in the parent application, the boron-containing Raney iron can also be made without a diffusion treatment. For example, a batch of aluminum is melted, and then iron and boron are dissolved in the melt to make $FeAl_2$ containing about 20% boron by weight of the iron. The melt is then solidified, crushed to a powder, and leached to extract most of the aluminum from the powder. The leached product will still contain as much as 25% aluminum by weight, and is highly pyrophoric.

Nickel can be substituted for the iron in the making of a powdered Raney alloy for use in the foregoing oxidative decomposition of polytetrafluoroethylene resin. Such Raney nickel can also contain boron to increase its pyrophoric heat liberation.

Pyrophoric iron and nickel foils can also be stabilized, preferably by suspending them in cold water and bubbling air through the suspension. Such pyrophoric foils can be made on a large scale basis by starting with a commercial aluminum-dipped 3 to 6 mil iron foil containing about 3 mils aluminum on each face, cold reducing the dipped product to about one-third its thickness, and then heating the cole-reduced material at about 600° C. in an aluminum chloride atmosphere for about three hours to yield a product about $1\frac{1}{2}$ to 3 mils thick both surfaces of which are very rich in both aluminum and iron. This product is then leached as indicated above. The aluminum into which the iron foil is dipped can contain up to about 12% silicon, and a dip coating of such aluminum-silicon alloy is less likely to delaminate.

Iron or nickel foil can also be activated by unreeling from a spool and passing it through an aluminizing retort, preferably while holding a wide strip of the foil on its edge so that it is in a vertical plane. The aluminizing is uniform, particularly where the aluminizing is effected with a diffusion powder pack as described in Ser. No. 172,671. The aluminized foil can then be passed through a leaching tank.

Regardless of how an activated leached iron or nickel surface is obtained, it can used for many catalytic purposes including the oxidation of methane, and such use is improved by depositing on the surface a film of platinum or palladium, or a thin layer of fine zirconium oxide powder. Metal films are readily deposited by electroplating or in the case of platinum-family metals by decomposing the chloride or other salt of such metal. Powders can be applied by mixing them with colloidal alumina or silica in suspension in water, then applying the suspension and finally permitting the water to evaporate. The $ZrO_2$ changes the wave length of the radiation emitted when the activated surface pyrophorically reacts.

Obviously, many modifications and variations of the present invention are possible in the light of the above teachings. It is, therefore, to be understood that within the scope of the appended claims the invention may be practiced otherwise than as specifically described.

What is claimed is:

1. A composition that is stable when cold, but when heated generates a copious quantity of $NO_2$, the composition consisting essentially of a powdered nitrate that liberates $NO_2$ when heated, mixed with a powdered trigger that starts such generation upon heating, the trigger being stabilized Raney iron combined with boron.

2. The process of stabilizing pyrophoric iron powder, characterized by bringing the pyrophoric particles into good thermal contact with a cool heat sink, and then subjecting those particles while in such good thermal contact, to oxygen to cause a very thin protective surface oxide to form on the particles without increasing the particle temperature sufficiently to trigger uncontrollable pyrophoric action.

3. The combination of claim 2 in which the particles are no larger than about 2 mils in size, and the heat sink is a metal plate.

4. The combination of claim 1 in which the Raney iron is alloyed with up to about 28% boron by weight.

5. A composition that generates large quantities of poisonous fluorine-containing gas when heated, the composition consisting essentially of a mixture of powdered polytetrafluoroethylene with a source of oxygen and sufficient powdered Raney iron to initiate the oxidative decomposition of the polymer.

6. The composition of claim 5 in which the source of oxygen is a chlorate or perchlorate.

7. The combination of a pyrotechnic non-pyrophoric porous substrate that burns when ignited but is not readily ignited, and in the pores of the substrate a powdered igniter that when heated to about 100° C. reacts with air to generate sufficient heat to ignite the substrate.

8. The combination of claim 7 in which the igniter is a stabilized Raney alloy.

9. The combination of claim 8 in which the Raney alloy contains boron.

* * * * *